(12) United States Patent
Carpenter et al.

(10) Patent No.: US 8,382,920 B2
(45) Date of Patent: Feb. 26, 2013

(54) METHODS OF PRODUCING DEFORMED METAL ARTICLES

(75) Inventors: Craig M. Carpenter, Birdsboro, PA (US); James D. Maguire, Jr., Jefferson, PA (US)

(73) Assignee: Global Advanced Metals, USA, Inc., Waltham, MA (US)

( * ) Notice: Subject to any disclaimer, the term of this patent is extended or adjusted under 35 U.S.C. 154(b) by 974 days.

(21) Appl. No.: 11/715,259

(22) Filed: Mar. 7, 2007

(65) Prior Publication Data
US 2007/0209741 A1    Sep. 13, 2007

Related U.S. Application Data

(60) Provisional application No. 60/779,735, filed on Mar. 7, 2006.

(51) Int. Cl.
C22F 1/18    (2006.01)
(52) U.S. Cl. ...................................................... 148/668
(58) Field of Classification Search .................... 148/668
See application file for complete search history.

(56) References Cited

U.S. PATENT DOCUMENTS

| | | | |
|---|---|---|---|
| 1,370,328 A | 10/1920 | Lowe | |
| 2,516,863 A | 8/1950 | Gardner | |
| 3,489,533 A * | 1/1970 | Lelik, Jr. et al. | 428/577 |
| 3,925,187 A | 12/1975 | Bernard | |
| 3,954,514 A | 5/1976 | Webster et al. | 148/11.5 |
| 4,092,181 A | 5/1978 | Paton et al. | 148/12.7 |
| 4,141,719 A | 2/1979 | Hakko | |
| 4,231,790 A | 11/1980 | Hahn et al. | |
| 4,386,513 A | 6/1983 | Doudet | 72/256 |
| 4,511,409 A | 4/1985 | Ferton et al. | 148/2 |
| 4,684,399 A | 8/1987 | Bergman et al. | |
| 4,721,537 A | 1/1988 | Ghosh | 148/12.7 |
| 4,722,754 A | 2/1988 | Ghosh et al. | 148/11.5 |
| 4,722,755 A | 2/1988 | Maehara | 148/12 |
| 4,842,706 A | 6/1989 | Fukasawa et al. | |
| 4,844,746 A | 7/1989 | Hormann et al. | |
| 5,087,297 A | 2/1992 | Pouliquen | 148/2 |
| 5,122,196 A | 6/1992 | Fernandez | 148/552 |
| 5,160,388 A | 11/1992 | Legresy et al. | 148/552 |
| 5,209,910 A | 5/1993 | Bludssus et al. | |
| 5,648,045 A | 7/1997 | Masahashi et al. | 420/418 |
| 5,665,180 A | 9/1997 | Seetharaman et al. | 148/527 |
| 5,687,600 A | 11/1997 | Emigh et al. | |
| 5,693,159 A | 12/1997 | Athey et al. | 148/677 |

(Continued)

FOREIGN PATENT DOCUMENTS

| AU | 700944 | 8/1995 |
|---|---|---|
| AU | 1162395 | 8/1995 |

(Continued)

OTHER PUBLICATIONS

J.V. Ringwood and M.J.Grimble, "Shape Control in Sendzimir mills Using Both Crown and Intermediate Roll Actuators", IEEE Trans. Automat. Contr., vol. AC-35, 1990.*

(Continued)

*Primary Examiner* — Roy V. King
*Assistant Examiner* — Jessee Roe
(74) *Attorney, Agent, or Firm* — Kilyk & Bowersox, P.L.L.C.

(57) ABSTRACT

A method of making metal articles as well as sputtering targets is described, which involves deforming an ingot to preferred dimensions. In addition, products made by the process of the present invention are further described.

47 Claims, 12 Drawing Sheets
(5 of 12 Drawing Sheet(s) Filed in Color)

U.S. PATENT DOCUMENTS

| | | | |
|---|---|---|---|
| 5,846,351 A | 12/1998 | Masahashi et al. | 148/671 |
| 5,850,755 A | 12/1998 | Segal | 72/261 |
| 6,193,821 B1 | 2/2001 | Zhang | 148/668 |
| 6,238,494 B1 | 5/2001 | Segal | |
| 6,264,813 B1 | 7/2001 | Leroy et al. | |
| 6,312,642 B1 | 11/2001 | Fife | |
| 6,331,233 B1 | 12/2001 | Turner | 204/298.13 |
| 6,348,113 B1 | 2/2002 | Michaluk et al. | 148/668 |
| 6,348,139 B1 | 2/2002 | Shah et al. | 204/298.13 |
| 6,462,339 B1 | 10/2002 | Michaluk et al. | 250/310 |
| 6,566,161 B1 | 5/2003 | Rosenberg et al. | 438/77 |
| 2002/0072475 A1 | 6/2002 | Michaluk et al. | |
| 2002/0112789 A1 | 8/2002 | Jepson et al. | |
| 2002/0125128 A1 | 9/2002 | Turner | |
| 2002/0157736 A1 | 10/2002 | Michaluk | 148/422 |
| 2003/0019746 A1 | 1/2003 | Ford et al. | 204/298.13 |
| 2003/0037847 A1 | 2/2003 | Michaluk et al. | |
| 2004/0072009 A1 | 4/2004 | Segal et al. | 428/561 |
| 2004/0154707 A1 | 8/2004 | Buck | 148/609 |
| 2004/0245099 A1 | 12/2004 | Hukushima | 204/298.12 |
| 2004/0256035 A1 | 12/2004 | Yamakoshi et al. | 148/676 |
| 2005/0236076 A1 | 10/2005 | Michaluk et al. | |
| 2005/0252268 A1 | 11/2005 | Michaluk et al. | |
| 2007/0089815 A1 | 4/2007 | Wickersham, Jr. et al. | |

FOREIGN PATENT DOCUMENTS

| | | |
|---|---|---|
| CA | 2090919 | 9/2004 |
| DE | 3790259 C2 | 6/1987 |
| EP | 0 285 741 B1 | 1/1988 |
| EP | 0 281 141 B2 | 6/2000 |
| EP | 1 366 203 B1 | 9/2006 |
| JP | 1-290766 | 11/1989 |
| JP | 3-197640 | 12/1989 |
| JP | 4-178940 | 11/1990 |
| JP | 264232-1994 | 9/1994 |
| JP | 2000-158178 | 6/2000 |
| JP | 2001 040470 | 2/2001 |
| WO | WO 87/07650 | 12/1987 |
| WO | WO 99/61670 | 12/1999 |
| WO | WO 99/66100 | 12/1999 |
| WO | 2004064114 A2 | 7/2004 |
| WO | WO 2004/111295 A1 | 12/2004 |

OTHER PUBLICATIONS

International Search Report for International Application No. PCT/US2007/005584, dated Oct. 10, 2007, three pages.

Written Opinion for International Patent Application No. PCT/US2007/005584 dated Oct. 10, 2007 (9 pages).

J.B. Clark et al., "*Influence of Transverse Rolling on the Microstructural and Textural Development in Pure Tantalum*," Metallurgical Transactions A, 23A, pp. 2183-2191 (1992).

C. Pokross, "*Controlling the Texture of Tantalum Plate*," Journal of Metals, Oct. 1989, pp. 46-49.

Savitskii et al., "Interatomic Bond and Crystal Structure," (pp. 47-51), and "Single Crystals," (pp. 176-179), Physical Metallurgy of Refractory Metals and Alloys.

Kumar et al., "Corrosion Resistant Properties of Tantalum," Corrosion 95 The NACE International Annual Conference and Corrosion Show, Paper No. 253 (1995).

Kock et al., "Tantalum—Processing, Properties and Applications," JOM, Oct. 1989, pp. 33-39.

Clark et al., "Effect of Processing Variables on Texture and Texture Gradients in Tantalum," Metallurgical Transactions A, vol. 22A, Sep. 1991, 2039-2048.

Wright et al., " . . . in the Mechanical Behavior of a Tantalum Plate," Metallurgical and Materials Transactions A, vol. 25A, May 1994, pp. 1025-1031.

Feng et al., " . . . Texture in Cold-Rolled Ta Ingot," JOM, Oct. 1989, pp. 40-45.

Michaluk, "Factors Affecting the Mechanical Properties and Texture of Tantalum," (13 pages).

Hashimoto et al., "High Quality $Ta_2O_5$ Films Using Ulta-High Purity Ta Sputtering Target," Extended Abstracts of the $18^{th}$ (1986 International) Conference on Solid State Devices and Materials, Tokyo, 1986, pp. 253-256.

Mundekis, "Effects of Rolling Schedule and Annealing on the High Strain Rate Behavior of Tantalum," presented at TMS Meeting in Cincinnati, Ohio, 1991.

Cardonne et al., "Refractory Metals Forum: Tantalum and Its Alloys," Advanced Materials & Processes, Sep. 1992, pp. 16-20.

Cardonne et al., "Tantalum and Its Alloys," Int. J. of Refractory Metals & Hard Materials, No. 13, 1995, pp. 187-194.

Clark et al., "Influence of Initial Ingot Breakdown on the Microstructural and Textural Development of High-Purity Tantalum," Metallurgical Transactions A, vol. 22A, Dec. 1991, pp. 2959-2968.

Office Action from corresponding Austrian Patent Application No. A 9106/2007 dated Aug. 24, 2009, with English translation attached (7 pages).

Office Action issued in corresponding Japanese Patent Application No. 2008-558336, mailed Apr. 5, 2011 (with English translation attached) (8 pages).

Office Action issued in corresponding Estonian Patent Application No. P200800048 dated Dec. 3, 2010 (with English translation) (6 pages).

\* cited by examiner

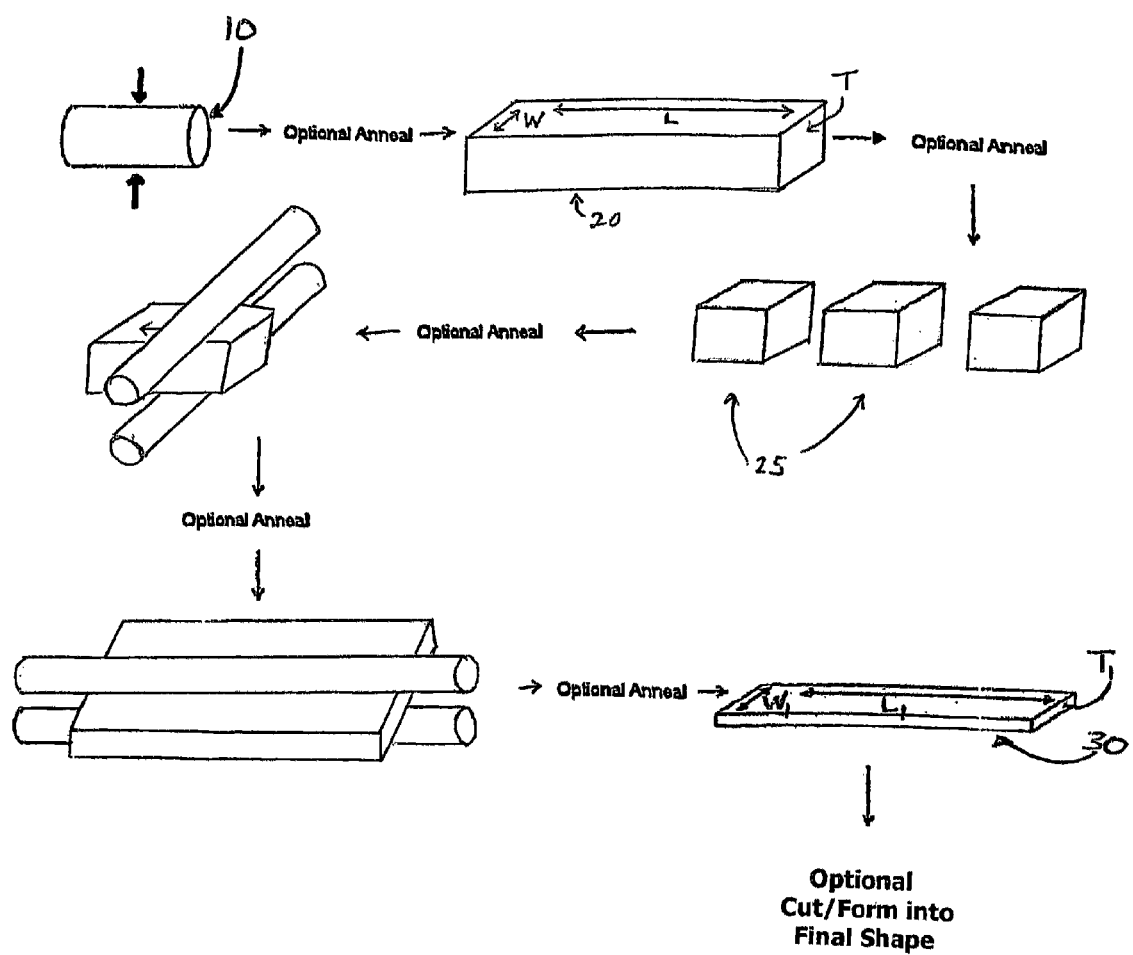

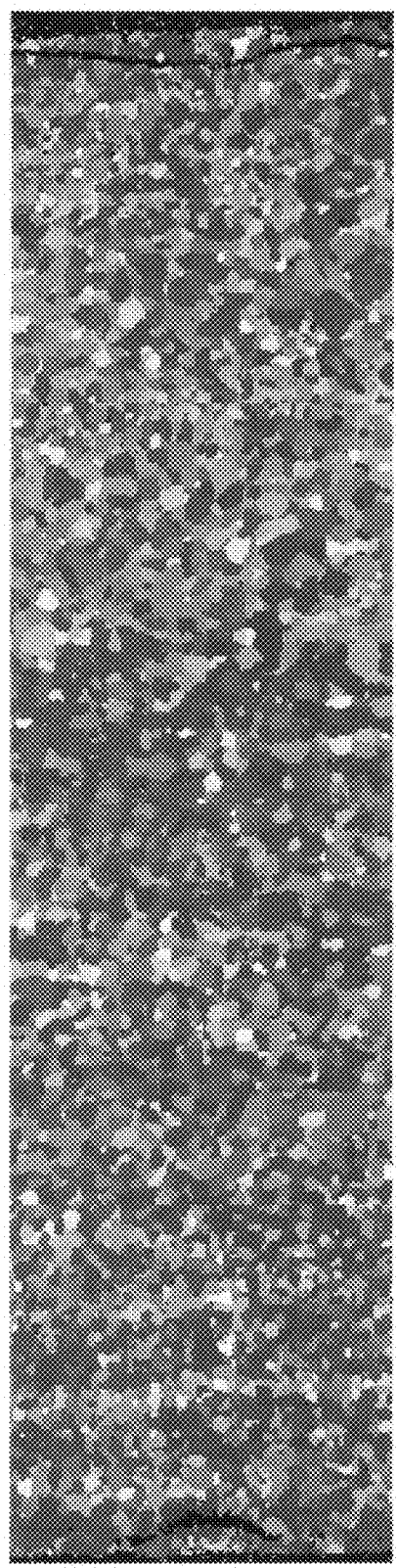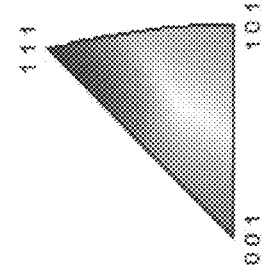
Figure 4. Orientation color coded map
Scan dimensions:
X = 8180 microns
Y = 2050 microns
Step size = 10 microns

Figure 5. Crystal direction map
5 degree tolerance
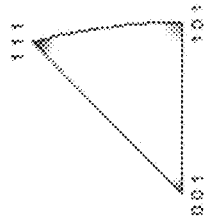

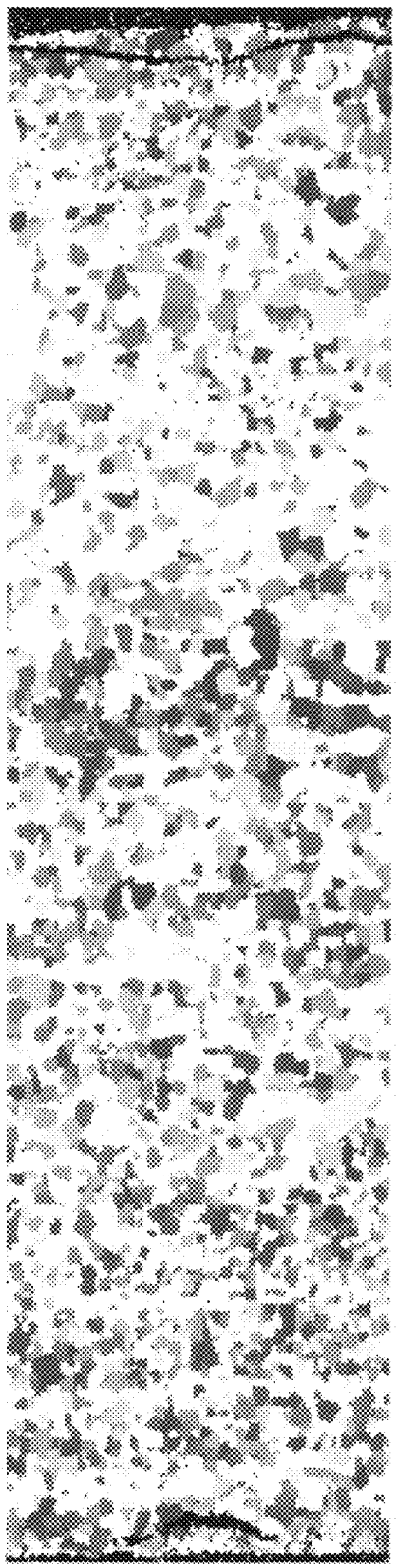
Figure 6. Crystal direction map
10 degree tolerance
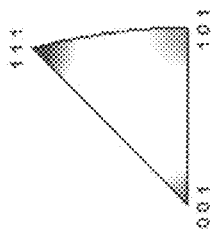

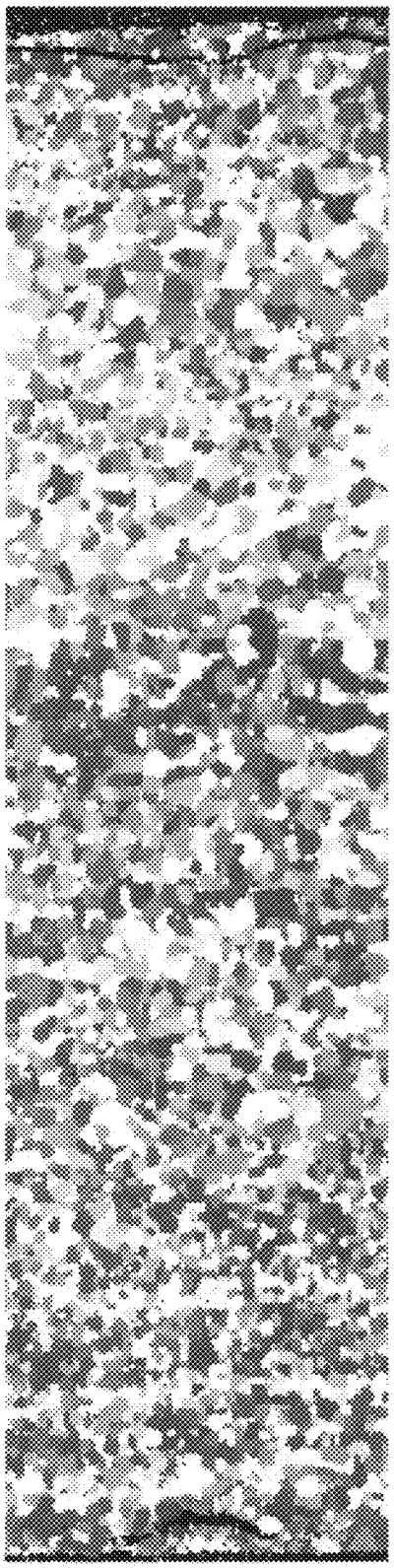
*Figure 7. Crystal direction map*
*15 degree tolerance*
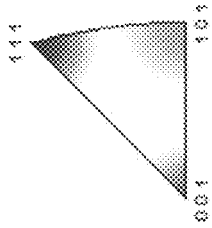

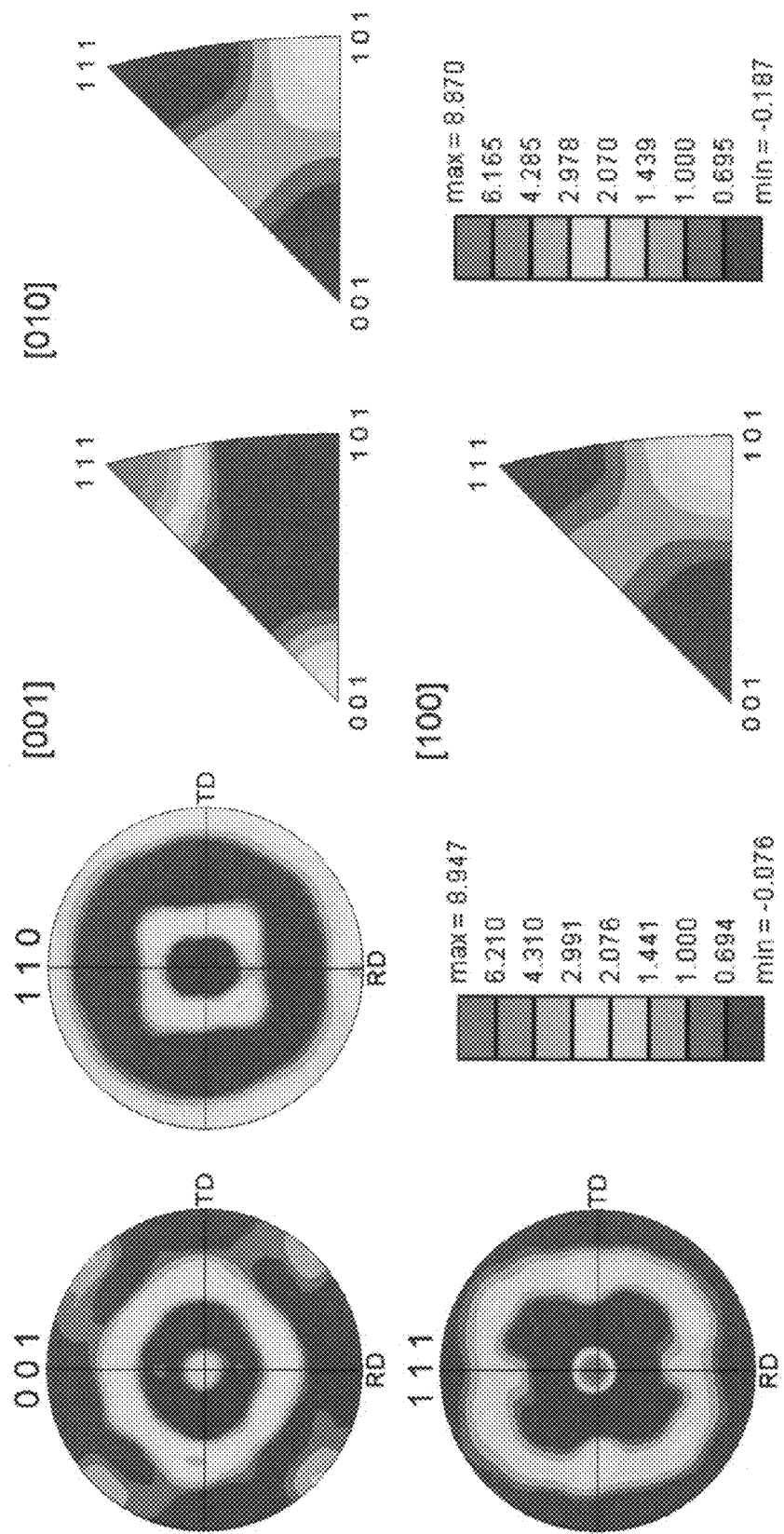
Figure 9. Inverse pole figure plots
Figure 8. Pole figure plots

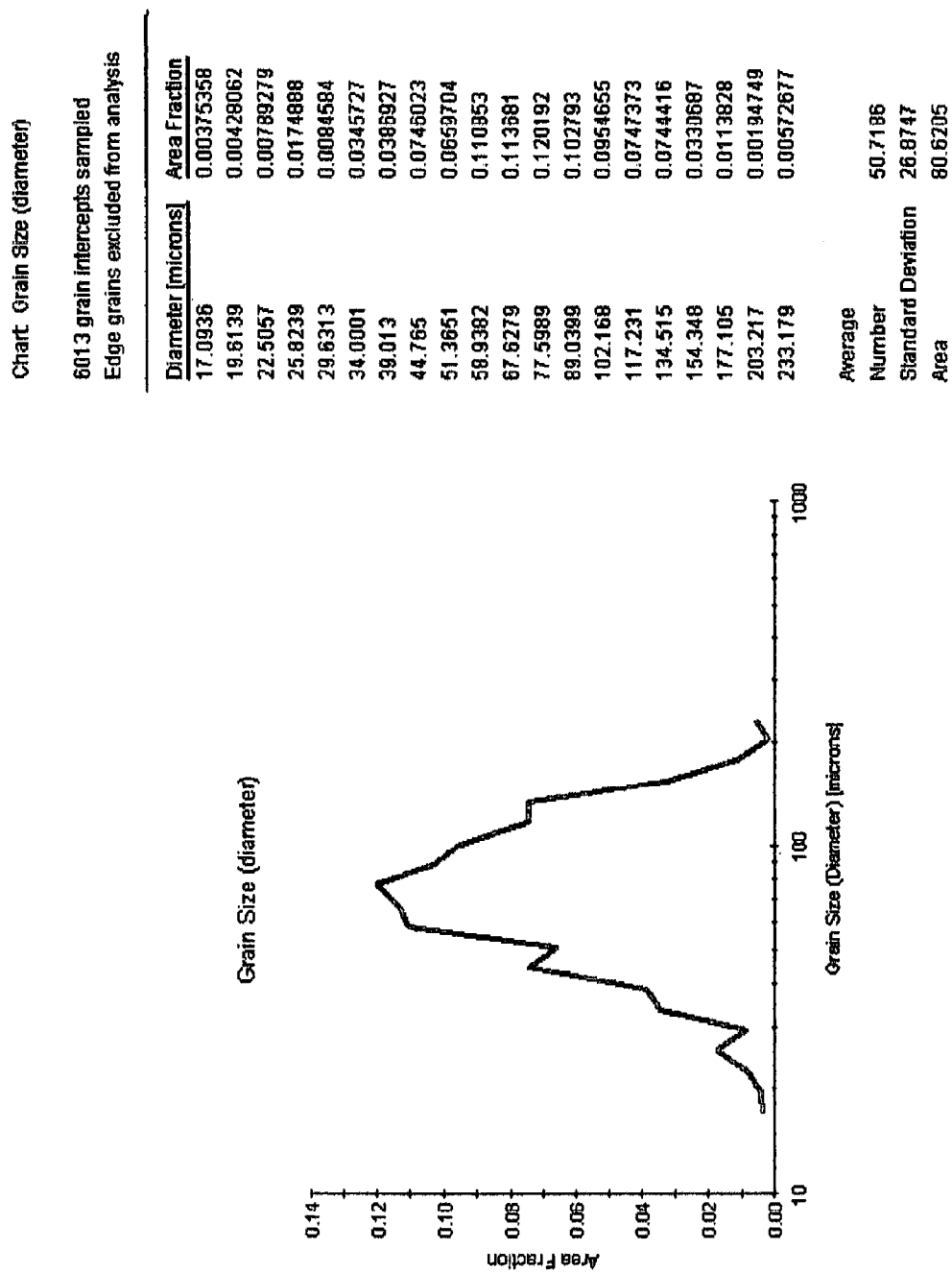
Figure 10. Grain size histogram and data

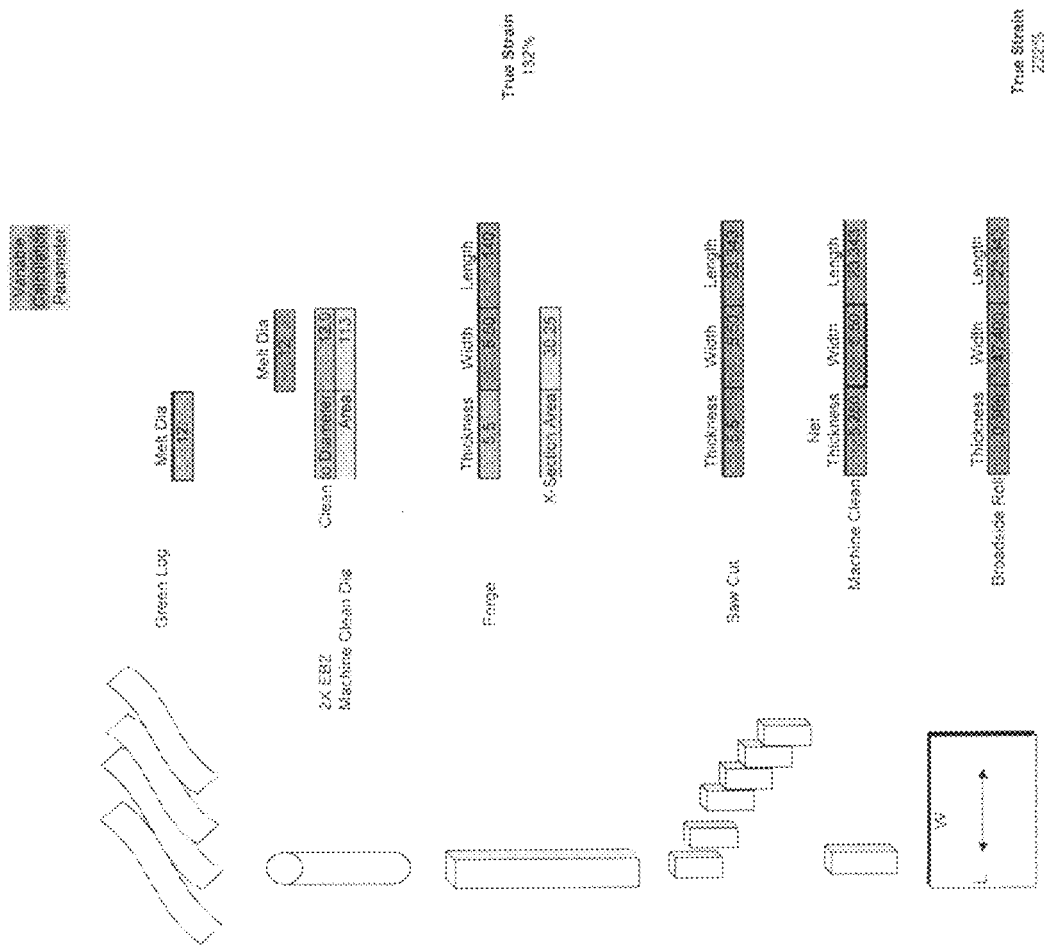

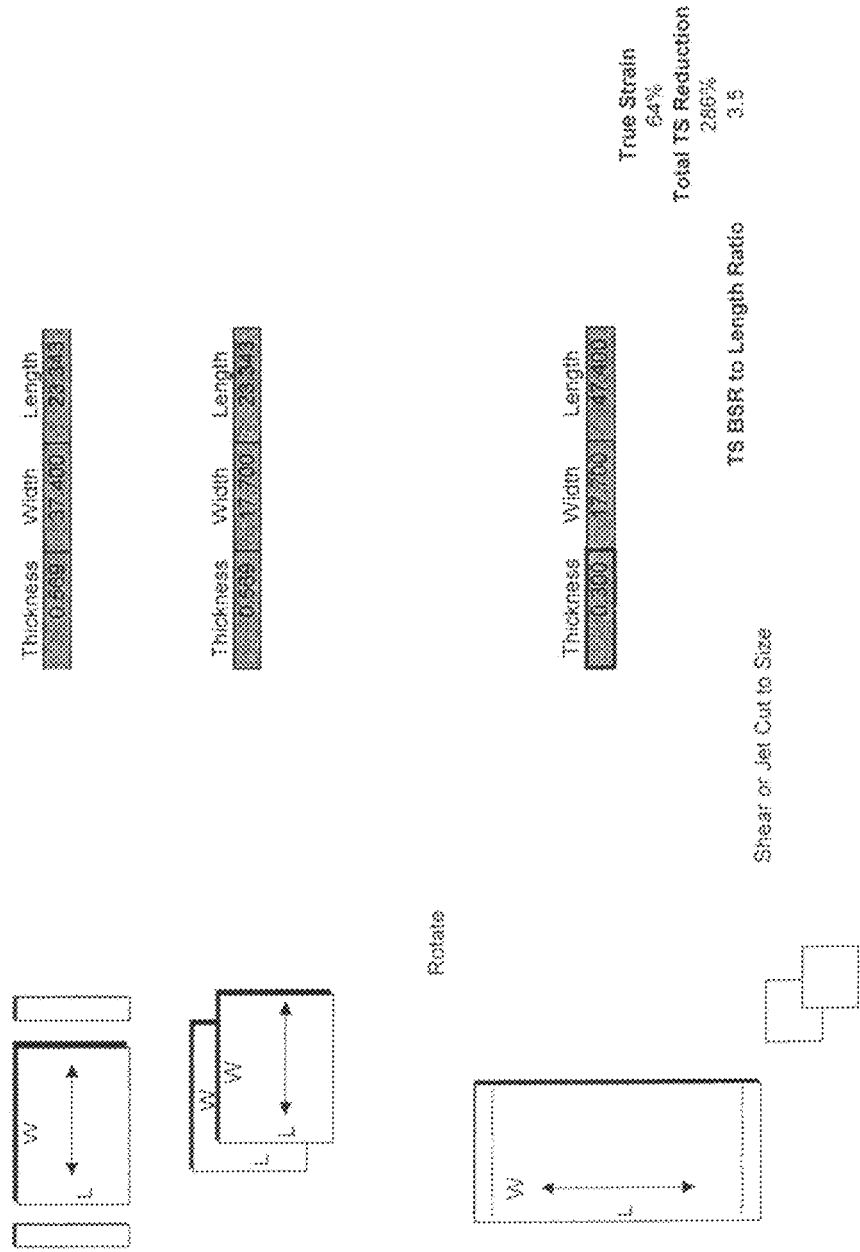

Locations for Metal Article or Disc Characterization

METHODS OF PRODUCING DEFORMED METAL ARTICLES

This application claims the benefit under 35 U.S.C. §119 (e) of prior U.S. Provisional Patent Application No. 60/779,735, filed Mar. 7, 2006, which is incorporated in its entirety by reference herein.

BACKGROUND OF THE INVENTION

The present invention relates to metal billets, slabs, plates, rods, and sputter targets and other metal articles. More particularly, the present invention relates to a method of producing a metal preferably having a uniform fine grain size, a homogeneous microstructure, low texture banding, and/or an absence of surface marbleizing that is useful in making sputter targets and other objects.

Certain observable properties of sputter targets and sputter target materials are desirable for enhancing the sputtering performance of valve metal sputter targets (See, e.g., Michaluk, "Correlating Discrete Orientation and Grain Size to the Sputter Deposition Properties of Tantalum," *JEM*, January, 2000; Michaluk, Smathers, and Field, *Twelfth International Conference on Texture of Materials*, J. A. Szpunar (ed.), National Research Council of Canada, 1999, p. 1357). Fine grain size and homogeneous microstructure that is substantially free of sharp texture bands are examples of such properties. Grain size, grain uniformity, and textural homogeneity of metal material, generally, and of target material in particular, are measurable qualities, by methods described, for example, in U.S. Pat. No. 6,462,339 B1 (Michaluk et al.), and Wright et al., "*Scalar Measures of Texture Heterogeneity*," MATERIAL SCIENCE FORUM, Vols. 495-497 (September 2005) pp. 207-212, all incorporated herein in their entirety by reference.

Hence, an ongoing interest exists in relevant markets to develop processes for producing high purity metal articles, like sputter targets having the above-described metallurgical and textural qualities. Conventional metalworking multi-step sequences incorporating forging and/or rolling steps, combined with one or more intermediate annealing steps as well as one or more cleaning steps, are typically used in manufacturing suitable mill forms and are generally described by C. Pokross, "*Controlling the Texture of Tantalum Plate*," JOURNAL OF METALS, October 1989, pp. 46-49; and J. B. Clark, R. K. Garrett, Jr., T. L. Jungling, R. I. Asfahani, "*Influence of Transverse Rolling on the Microstructural and Textural Development in Pure Tantalum*," METALLURGICAL TRANSACTIONS A, 23A, pp. 2183-91 (1992), which are incorporated herein in their entirety by reference. An example of a multi-step forging, cleaning, annealing, and rolling process to produce a tantalum sputter target having fine grain size and a homogeneous texture is described in U.S. Pat. No. 6,348,113 (Michaluk et al.), incorporated herein in its entirety by reference.

Tantalum has emerged as the primary diffusion barrier material for copper interconnects employed in advanced integrated circuit microelectronic devices. During the fabrication sequence of such microelectronic devices, tantalum or tantalum-nitride barrier films are deposited by physical vapor deposition (PVD), a well-established process whereby a source material (termed a "sputtering target") is eroded by high-energy plasma. Bombardment and penetration of plasma ions into the lattice of the sputtering target causes atoms to be ejected from the surface of the sputtering target which then deposit atop the substrate. The quality of sputter-deposited films is affected by many factors, including the chemistry and metallurgical homogeneity of the sputtering target.

In recent years, research efforts have focused on developing processes to increase the purity, reduce the grain size, and control the texture of tantalum sputtering target materials. For example, U.S. Pat. No. 6,348,113 (Michaluk et al.) and U.S. Patent Application Nos. 2002/0157736 (Michaluk) and 2003/0019746 (Ford et al.), each of which is incorporated herein by reference, describe metalworking processes for attaining select grain sizes and/or preferred orientations in tantalum materials or tantalum sputtering target components through particular combinations of deformation and annealing operations.

A method suitable for producing large lots and bulk quantities of high purity tantalum sputtering targets having microstructural and textural homogeneity is described in U.S. Pat. No. 6,348,113 (Michaluk et al.). While high volume manufacturing processes offer significant cost benefits compared to batch processes, they often cannot achieve tight dimensional tolerances by means of a standardized and repeatable deformation sequence. The mechanical responsiveness of high purity tantalum ingots and heavy rolling slabs is highly variable due to their large, inhomogeneous grain structure. Imposing a predefined and consistent rolling reduction schedule on heavy slabs of high purity tantalum can result in a divergence in plate thickness with each reduction pass, and ultimately would yield plate products having an excessive variation in gauge. Because of this behavior, conventional methods for rolling tantalum plate from heavy slab is to reduce the mill roll gap by a certain amount depending on the width and gauge of the plate, then adding light finishing passes to achieve gauge tolerances typically about +/−10% of the target thickness.

Some rolling theory prescribes that heavy reductions per rolling pass are necessary to achieve a uniform distribution of strain throughout the thickness of the component, which is beneficial for attaining a homogeneous annealing response and a fine, uniform microstructure in the finished plate. Scale presents a primary factor that hinders the ability to take heavy rolling reduction when processing high volume tantalum slabs to plate since heavy reduction (e.g., true strain reduction) may represent more of a bite than the rolling mill can handle. This is especially true at the commencement of rolling where the slab or plate thickness is largest. For example, a 0.2 true strain reduction of a 4" thick slab requires a 0.725" reduction pass. The separating force that would be necessary to take such a heavy bite would exceed the capability of conventional production rolling mills. Conversely, a 0.2 true strain reduction on a 0.40" thick plate equates to only a 0.073" roll reduction, which is well within the capabilities of many manufacturing mills. A second factor that affects the rolling reduction rate of tantalum is the plate width. For a given roll gap per pass, plate gauge, and mill, wider plates will experience a smaller amount of reduction per rolling pass than narrow plates.

Since the processing of bulk tantalum cannot rely solely on heavy rolling reductions to reduce slab to plate, strain is not likely to be uniformly distributed throughout the thickness of the plate. As a result, the product does not evenly respond to annealing, as evidenced by the existence of microstructural and textural discontinuities in tantalum plate as reported in the literature (e.g., Michaluk et al. "Correlating Discrete Orientation and Grain Size to the Sputter Deposition Properties of Tantalum," *JEM*, January, 2002; Michaluk et al., "Tantalum 101: The Economics and Technology of Tantalum," *Semiconductor Inter.*, July, 2000, both of which are incorporated herein by reference). The metallurgical and textural homogeneity of annealed tantalum plate is enhanced by incorporating intermediate anneal operations to the process as taught by U.S. Pat. No. 6,348,113. However, incorporating one or more intermediate annealing operations during the processing of tantalum plate will also reduce the total strain that is imparted to the final product. This, in turn, would lessen the annealing response of the plate, and hence limit the ability to attain a fine average grain size in the tantalum product.

The existence or occurrence of a marbleized structure in tantalum has been deemed to be detrimental to the performance and reliability of tantalum sputtering target material and components. It has only recently been discovered by the inventors that two distinct types of marbleizing can be found in tantalum and other metals: marbleizing observed along the sputtered surface of an eroded tantalum target or component, and marbleizing observed about the as-fabricated surface of the tantalum target or component. In an eroded tantalum sputtering target, marbleizing is formed from the mixture of exposed, sputter-resistant (100) texture bands (that appear as lustrous regions) about the matte finish of the matrix material (created by multi-facet sputter-eroded grains). The propensity for marbling of a sputter-eroded surface is minimized by or eliminated in tantalum sputtering targets or components that are processed to have a homogeneous texture through the thickness of the tantalum target, as described in U.S. Pat. No. 6,348,113. An analytical method for quantifying the texture homogeneity of tantalum sputtering target materials and components is described in U.S. Pat. No. 6,462,339 (Michaluk et al.), which is incorporated herein by reference. Another analytical method for quantifying banding is described in U.S. Patent Application No. 60/545,617 filed Feb. 18, 2004 and is incorporated herein by reference.

Surface marbling can be resolved along the as-fabricated surface of wrought tantalum materials or sputtering components after light sputtering (e.g., burn-through trials) or by chemical etching in solutions containing hydrofluoric acid, concentrated alkylides, or fuming sulfuric and/or sulfuric acid, or other suitable etching solutions. In annealed tantalum plate, surface marbleizing appears as large, isolated patches and/or a network of discolored regions atop the acid cleaned, as-rolled surface. The marbleized surface of tantalum can be removed by milling or etching about 0.025" of material from each surface; however, this approach for eliminating surface marbling is economically undesirable. Surface marbling can be considered regions that have different average grain size in the regions and/or regions of differing primary texture (e.g., (100) vs. (111)). Surface marbling can be more due to grain size variances, wherein the regions can have a variance in average grain size of ±2 ASTM or more, such as ±2 ASTM to ±5 ASTM, or ±2 ASTM to ±4 ASTM, or ±2 ASTM to ±3 ASTM, when comparing the average grain size in one region to the average grain size in another region.

Accordingly, a need exists for a method to produce a sputter target material having superior metallurgical and textural qualities, and to reduce the costs associated with production of sputter targets exhibiting such qualities.

SUMMARY OF THE PRESENT INVENTION

It is therefore a feature of the present invention to provide a method of producing a metal having uniform fine grain size and/or textural homogeneity and optionally of dimensions sufficient for dividing into multiple slabs, or sputter targets.

Another feature of the present invention is to provide a process for deformation of a metal ingot.

A further feature of the present invention is to provide a large-scale manufacturing process for producing sputter targets.

A further feature of the present invention to provide a valve metal (or other metal) material or sputtering component that is substantially free of surface marbleizing.

Another feature of the present invention is to provide a process for producing bulk quantities of metal materials or sputtering components having a fine, homogeneous microstructure having an average grain size of about 150 microns or less, or 75 microns or less, and/or a uniform texture through the thickness of the metal material or sputtering component.

Another feature of the present invention is to provide a process for producing bulk quantities of metal materials or sputtering components having consistent chemical, metallurgical, and textural properties within a production lot of product.

Another feature of the present invention is to provide a process for producing bulk quantities of metal materials or sputtering components having consistent chemical, metallurgical, and textural properties between production lots of product.

Another feature of the present invention is to provide a process for producing bulk quantities of metal (e.g., tantalum) materials or sputtering components having consistent chemical, metallurgical, and textural properties within production lots of product.

A further feature of the present invention is to provide a metal (e.g., tantalum) material having microstructural and textural attributes suitable for forming into components including sputtering components and sputtering targets such as those described in Ford, U.S. Published Patent Application No. 2003/0019746, which is incorporated in its entirety by reference herein.

A further feature of the present invention is to provide a formed metal (e.g., tantalum) component including formed sputtering components and sputtering targets having a fine, homogeneous microstructure having an average grain size of about 150 microns or less, 75 microns or less, or 20 microns or less, and/or a uniform texture through the thickness of the formed component, sputtering component, or sputtering target that sufficiently retains the metallurgical and textural attributes of the uniformed metal material without the need to anneal the component after forming.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of making a metal article having a final thickness. The method involves deforming a metal ingot to form a slab, like a rectangular slab, having a length, width, and thickness, wherein two of these dimensions are within 25% of each other, or within 15% of each other, and then conducting a first rolling of the slab to form an intermediate plate, wherein the first rolling includes one or more rolling passes. The method, as an option, further includes a second rolling of the intermediate plate to form a metal plate, wherein the second rolling includes one or more rolling passes, and wherein each of the rolling passes of the second rolling preferably imparts a true strain reduction of greater than about 0.06. The present invention further relates to products made from the process, including sputter targets and other components. The rolling steps can be cold rolling, warm rolling, or hot rolling steps.

It is to be understood that both the foregoing general description and the following detailed description are exemplary and explanatory only and are intended to provide a further explanation of the present invention, as claimed.

The accompanying drawings, which are incorporated in and constitute a part of this application, illustrate some of the embodiments of the present invention and together with the description, serve to explain the principles of the present invention.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 2 is a schematic representation of a deformation process according to one embodiment of the present invention.

FIG. 4 (in color) is an orientation color coded map with an inverse pole figure for a tantalum plate of the present invention.

FIG. 5 (in color) is a crystal direction map with a 5 degree tolerance for a tantalum plate of the present invention.

FIG. 6 (in color) is a crystal direction map with a 10 degree tolerance for a tantalum plate of the present invention.

FIG. 7 (in color) is a crystal direction map with a 15 degree tolerance for a tantalum plate of the present invention.

FIG. 8 (in color) are pole figure plots for (111), (001), and (110), and

FIG. 9 (in color) are the inverse pole figure plots for a tantalum plate of the present invention.

FIG. 10 is a grain size histogram and data for a tantalum plate of the present invention.

FIG. 11 is a flow chart showing various process steps and parameters for various embodiments of the present invention.

DETAILED DESCRIPTION OF THE PRESENT INVENTION

Figure 1A:
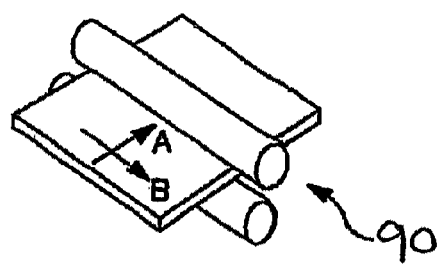
FIGS. 1a and 1b illustrate a transverse rolling process.

The present invention relates to a method of producing a deformed metal optionally having dimensions sufficient to be divided to form a plurality slabs, billets, rods, plates, and the like, which can then be formed into metal articles, such as sputter targets. The valve metal can have superior metallurgical and textural qualities. Preferably, the metal has a uniform fine grain size and a homogeneous microstructure and/or is devoid or substantially devoid of texture gradients. For example, the metal can be a valve metal, wherein the valve metal can have an average grain size of less than about 100 microns and/or a texture that is substantially void of textural bands (or banding), like (100) textural bands or other types of (x, y, z) textural bands. The present invention also relates to methods and metal products useful in a number of technologies, including the thin films area (e.g., sputter targets and other components, performs to such targets, and the like). In part, the present invention relates to methods to prepare metal material having desirable characteristics (e.g., texture, grain size, and the like) and further relates to the product itself. In one embodiment, the method first involves the processing of a metal ingot (such as a tantalum ingot), preferably into a rectangular form or other suitable forms for deformation processing (e.g., forming a slab from an ingot having a rectangular cross section, square cross section, octagonal cross section, or circular cross section). The ingot can be commercially available.

The ingot can be prepared in accordance with the teachings of Michaluk et al., U.S. Pat. No. 6,348,113, incorporated herein by reference. With respect to the metal ingot, the metal ingot can be any diameter and length. The metal can be a bcc metal. The metal can be a valve metal, like tantalum or niobium, or can be an alloy containing at least one bcc metal or at least one valve metal. For purposes of the present invention, valve metals generally include tantalum, niobium, and alloys thereof, and also may include metals of Groups IVB, VB, and VIB, and aluminum and copper, and alloys thereof. Valve metals are described, for example, by Diggle, in "Oxides and Oxide Films," Vol. 1, pp. 94-95, 1972, Marcel Dekker, Inc., New York, incorporated in its entirety by reference herein. Valve metals are generally extracted from their ores and formed into powders by processes that include chemical reduction, as described for example, in U.S. Pat. No. 6,348,113, by a primary metal processor. Further metal refining techniques typically performed by a primary metal processor include thermally agglomerating the metal powder, deoxidizing the agglomerated metal powder in the presence of a getter material, and then leaching the deoxidized metal powder in an acid leached solution, as disclosed, for example, in U.S. Pat. No. 6,312,642. A primary metal processor can then subject the valve metal powder or melt feedstock to an electron beam or to vacuum arc melting or other melting technique to cast or form a metal ingot. The metal processed in the present invention can be a refractory metal but other metals could also be used. Specific examples of the type of metals that can be processed with the present invention include, but are not limited to, tantalum, niobium, copper, titanium, gold, silver, cobalt, and alloys thereof.

In at least one embodiment of the present invention, preferably, the metal ingot has a diameter of at least 8 inches, and more preferably, has a diameter of at least 9½ inches, at least 11 inches, at least 12 inches, or higher. For instance, the metal ingot can have a diameter of from about 10 inches to about 20 inches or from about 9½ inches to about 13 inches, or from 10 inches to 15 inches, or from 9½ inches to 15 inches, or from 11 inches to 15 inches. The height or length of the ingot can be any amount, such as at least 20 inches, at least 30 inches, at least 40 inches, at least 45 inches, and the like. For instance, the length or height of the ingot can be from about 20 inches to about 120 inches or from about 30 inches to about 45 inches. The ingot can be cylindrical in shape, though other shapes can be used. After the formation of the ingot and prior to any deforming of the ingot, optionally, the ingot can be machine cleaned using conventional techniques. For instance, the machine cleaning (off the surface) can result in a reduction in the diameter of the ingot, such as diameter reduction of from about 1% to about 10%. As a specific example, the ingot can have a nominal as-cast diameter of 12 inches and, due to machine cleaning, can have a diameter after machine cleaning of 10.75 to 11.75 inches in diameter. In at least one embodiment of the present invention, the metal ingot is deformed to form a slab, which is preferably a rectangular slab, having a length, width, and thickness wherein at least two of these three dimensions are within 25% or within 15% of each other. More preferably, at least two of the three dimensions are within 10% or within 5% or within 1% of each other, such as from within 0.1 to 25%, or from 0.5% to 15%, or from 1% to 10% of each other. In other words, at least two of the three dimensions have very similar dimensions. For instance, two of the three dimensions can be the width and the thickness of the slab that is formed after deforming the metal ingot. Most preferably, the two of the three dimensions are substantially the same or exactly the same in dimension. For instance, two of the three dimensions, such as thickness and width, are 5 to 5½ inches each. In one or more embodiments, the metal ingot is deformed to form a slab having any cross-sectional shapes, such as a square cross-section, rectangular cross-section, octagonal cross-section, circular cross-section, and the like. This deforming into a slab preferably results in a reduction of the cross-sectional area of the ingot by at least 0.95 or 95% (true strain basis), and more preferably at least 1.0 or 100%, and even more preferably 1.2 or 120%, based on a true strain. The reduction in the cross-sectional surface area can be in a range from 0.95 to 5.0 or from 1.0 to 5.0, or from 1.1 to 4.7, or from 1.0 to 4.5, or from 1.1 to 4, or from 1.5 to 3, or from 2.0 to 4.0, and the like, based on a true strain basis. This reduction in the cross-sectional area can be calculated from determining the cross-sectional surface area of a cylindrical ingot lying on its side (i.e., $\pi R^2$) and then calculating the cross-sectional area of the slab, meaning the height × width. True strain reduction is calculated by the following formula: $\epsilon = \ln(T/T_0)$, wherein T is thickness before reduction and $T_0$ is thickness after reduction. In each case, the length of the ingot and the length of the resulting slab are ignored, since this is not part of the calculation of the cross-sectional area. For instance, if a 12-inch circular ingot is used, the cross-sectional surface area will be 113.1 square inches in cross-sectional area, and if this ingot is deformed into a rectangle having a square cross-sectional area where the width and the thickness are each 5½ inches, then the true strain reduction in cross-sectional area will be about 1.32 or about 132% reduction. The large percent reduction in cross-sectional area can be combined with the embodiment wherein at least two of the three dimensions, once the ingot is deformed into a slab, are within 25% or within 15% of each other or within 10% of each other or within 5% of each other or within 1% of each other, or substantially the same or identical.

The deforming of the metal ingot can be achieved using any standard metal working. Preferably, the deforming of the metal ingot to form the slab is by forging techniques, such as press forging, side forging, and/or upset forging alone (or other deforming techniques, such as extruding) or in combination with side forging, extrusion, and the like. Most preferably, the deforming of the metal ingot is by press forging, wherein the cylindrical metal ingot is lying on its side and is press forged on the top and bottom and then rotated 90° and subjected to further press forging and continuing this process until the desirable slab is formed having the dimensions described herein. This forging can occur in an open die. Upon the deforming of the metal ingot to form the slab, the slab can optionally have a cross section of a square or nearly a square with any desirable length. Other cross-sectional shapes can be achieved. The slab can be of sufficient size and volume to produce one or a multitude of metal articles, like plates, sputtering target blanks, and the like. For purposes of this invention, the end product can be any metal article and sputtering blanks is merely a preferred example. The slab should also have sufficient thickness to permit for the attainment of necessary amounts of work (e.g., cold working) during processing to achieve the proper annealing response and preferably avoid the formation of a marbilized surface. At this point, and strictly as an example only, the slab can have a thickness of from about 3 to about 11 inches, a width of from about 3 to about 11 inches, and a length of from about 18 to about 200 inches or more. The cross section of the slab can be rectangular, square, octagonal, double octagonal, or round. The dimensions given here are for a square or rectangular cross section. Similar dimensions where overall width and thickness of the slab (or area) are generally similar can be used for non-rectangular shapes.

The slab can be divided into multiple slabs after being formed into a slab or at any point thereafter using conventional metal cutting techniques, such as saw cutting. The number of divided slabs depends on the initial length and the desired dimensions of the finished metal article(s). For instance, a slab with a length of 150 to 200 inches can be divided into multiple slabs, for instance, each having a length of 20 to 40 inches, such as 30 inches. Preferably, the slab has a thickness of 4.5 to 6 inches, a width of 4.5 to 6 inches, a length of 30 inches, with rolling faces, preferably, with two opposing rolling surfaces that are flat within 0.040 inches or less. Other dimensions for purposes of the present invention may be used. For example, a rectangular form having a substantially square cross section can have a dimension of 5 inches by 5 inches by a length of greater than 30 inches. The slab(s) can optionally be machine cleaned in the same manner as described above. For instance, the two sides forming the thickness can be machine cleaned and a total of 0.250 inch can be removed (0.125 inches on each side). One or more or all surfaces can be cleaned as an option. The slab may be optionally thermally treated (e.g., annealed) one or more times, for instance, in a protective environment (e.g., inert or vacuum annealed) to achieve stress relief, partial recrystallization, and/or full recrystallization. The annealing conditions that can be used are described later herein. The slab(s) can then be subjected to at least a first rolling to form an intermediate plate, wherein the first rolling can include a plurality of rolling passes. The method can further involve, as an option, subjecting the intermediate plate to a second rolling to form a metal plate, wherein the second rolling can include a plurality of rolling passes, and wherein each of the rolling passes of the second rolling preferably imparts a true strain reduction of about 0.06 or more (e.g., 0.06 to 0.35 per pass, 0.06 to 0.25 per pass, 0.06 to 0.18 per pass, 0.06 to 0.16 per pass, 0.06 to 0.15 per pass, 0.06 to 0.13 per pass, 0.06 to 0.12 per pass, 0.06 to 0.10 per pass, 0.08 to 0.18 per pass, 0.09 to 0.17 per pass, 0.1 to 0.15 per pass), or for instance, about 0.12 or more, or for instance, no more than about 0.35 per pass. The final rolling pass of the second rolling can optionally impart a true strain reduction that is equivalent to or greater than a true strain reduction imparted by other rolling passes. At least one (and preferably all) of the rolling passes of the second rolling can be in a transverse direction relative to at least one of the rolling passes of the first rolling. The rolling passes of the first and/or second rolling can be multi-directional, clock rolling, and the like. The rolling steps can be cold rolling or warm rolling or hot rolling or various combinations of these rolling steps. The definition of true strain is $\epsilon = \ln(ti/tf)$, where $\epsilon$ is the true strain or true strain reduction, ti is the initial thickness (before reduction) of the plate, tf is the final thickness (after reduction) of the plate, and ln is the natural log of the ratio.

In one or more embodiments, each subsequent rolling pass in the first rolling and/or second rolling can be within 25% of the true strain reduction of the previous rolling pass, and can be within 20% or within 15%, or within 10%, or within 7%, or within 5%, or within 2.5%, or within 1% of the previous rolling pass. For instance, the true strain reduction of the subsequent rolling pass can be the same as or nearly the same as the true strain reduction of the previous rolling pass or can be within from 0.5% to 25% or within from 1% to 20% or within from 1.5% to 15% of the true strain reduction of the previous rolling pass. This option of the true strain reduction of next or subsequent rolling pass being close to the true strain reduction of previous rolling pass can contribute to a more uniform texture and/or grain size in the metal.

Figure 1B:
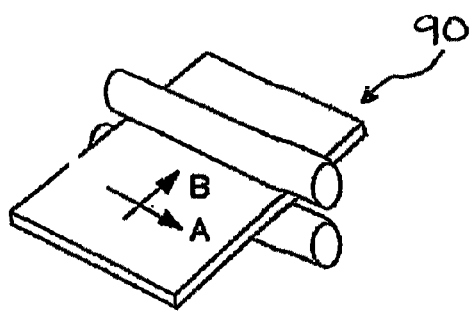

As stated, each slab is rolled (e.g., cold rolled, warm rolled, hot rolled) to produce a plate of desired gauge and size to yield one or a multitude of sputtering target blanks in accordance to the following criteria. The slab is rolled to form an intermediate plate having a thickness between that of the slab and the desired finished plate. For example, the intermediate plate can have a thickness of from about 0.3 to about 1.5 inches. The thickness of the intermediate plate, such that the true strain imparted in rolling from intermediate gauge to finished, can be about 0.35 or more, and preferably about 0.50 or more, or generally, in at least one embodiment, no more than 1.0, such as from about 0.35 to about 1.0 of the total true strain imparted in rolling the slab from intermediate gauge to final gauge. The final rolling of the second rolling can impart a true strain reduction that is equal to or greater than a true strain reduction imparted by any other rolling pass. For example, for cold rolling of a 5.25" slab into a finished plate having a thickness of 0.300" represents a total true strain reduction of 2.86; a finished plate rolled from an intermediate plate having a thickness of 0.569" would have a true strain imparted in rolling from intermediate gauge to finished of 0.64. Likewise, for example, a finished plate rolled from an intermediate plate having a thickness of 0.950" would have a true strain imparted in rolling from intermediate gauge to finished (0.300") of 1.15 with a true strain imparted when rolling from slab to intermediate plate of about 1.71. For purposes of the present invention, each rolling step described in the present invention can be a cold rolling step, a warm rolling step, or a hot rolling step, or any combination thereof. Furthermore, each rolling step can comprise one or more rolling steps wherein if more than one rolling step is used in a particular step, the multiple rolling steps can be all cold rolling, warm rolling, and/or hot rolling, or can be a mixture of various cold rolling, warm rolling, and/or hot rolling steps. These terms are understood by those skilled in the art. Cold rolling is typically at ambient or lower temperatures during rolling, whereas warm rolling is typically slightly above ambient temperatures such as 10° C. to about 25° C. above ambient temperatures whereas hot rolling is typically 25° C. or higher above ambient temperatures, wherein the temperature is the temperature of the metal. In the present invention, the rolling of the slab, such as the rectangular slab, can be achieved by any rolling schedule and rolling direction. For instance, the rolling of the slab can be achieved by cross or transverse rolling. The reductions achieved by rolling in two or more directions can be equal with respect to each direction or can be different for each direction. For instance, in one embodiment of the present invention, the slab can be subjected to transverse rolling in two directions, for instance, in the direction of the length and in the direction of the width, for instance, as shown in FIGS. 1A and 1B. The rolling in each of these directions can be similar from the standpoint of achieving the same % reduction in the thickness of the slab or the rolling can be different such that a % reduction in one direction is more than in another direction. The "first rolling" can be all in the same direction or different directions. Also, the "second rolling" can be all in the same direction or different directions. The first rolling can be in a direction that is different from the second rolling. For instance, in cross or transverse rolling, the first rolling can be all in one direction, and the second rolling can be 90° from the first rolling. As a further example, the true strain % reduction in one direction (with respect to % reduction in thickness) can be 100% or more, 150% or more, 200% or more, 250% or more, 300% or more, 350% or more, or 400% or more (e.g., from 100% to 500%, or from 150% to 400%) in one direction versus the other direction. For instance, the % reduction in the width direction (along the width) can be 50% to 400% more than in the length direction (along the length). As a further example, the reduction in one direction can be on the order of 60% to 300% or from about 50% to about 85% or from about 70%, wherein these percent reductions are with reference to the reduction in the starting thickness of the slab prior to rolling. In one or more embodiments, the slab, which is preferably rectangular, has a thickness prior to the first rolling that is at least 5 times thicker than the final thickness of the metal article, or is at least 10 times thicker than the final thickness of the metal article, or is at least 15 times thicker than the final thickness of the metal article, or is at least 20 times thicker than the final thickness of the metal article, such as from about 5 times to about 20 times thicker than the final thickness of the metal article. Also, for purposes of the present invention, prior to any working of the metal or after any working of the metal (e.g., rolling and the like), the metal material can be thermally treated (e.g., annealed) one or more times (e.g., 1, 2, 3, 4, or more times) in each working step. This thermal treatment can achieve stress release, and/or partial or complete recrystallization.

In the rolling of a large slab to intermediate plate, it is often not practical nor is it necessary to take heavy strain reductions with each rolling pass to attain uniform work in the intermediate plate. One purpose of rolling from slab to intermediate plate is to produce an intermediate form by a controlled and repeatable process. The intermediate form can be of sufficient size so that it can then be rolled to a finish plate or plates of sufficient size to yield one or more metal articles, like sputtering target blanks. It is preferred to control the process so that the rate of reduction from slab to intermediate plate is repeatable from slab to slab, and so that the amount of lateral spread of the slab is limited to optimize the yield of product from the slab. Should the length of the work piece be spread beyond an allowable limit, then it would be difficult to roll the intermediate plate to the target gauge range and concurrently attain the minimum width necessary to optimize product yield. In at least one embodiment, the intermediate plate has a length that is greater than the length of the slab by at least about 10% or more (e.g., from 10% to 50%, or from 15% to 45%, or from 20% to 40%).

The process of rolling slab to intermediate plate can begin with taking small reductions per each rolling pass. For instance, see Tables 1-3 herein. While the rolling schedule for rolling slab to intermediate plate can be defined to target a desired true strain reduction per pass, such an approach would be difficult and time consuming to implement, monitor, and verify compliance. A more preferred approach is to roll slab to intermediate plate using a rolling schedule defined by changes in mill gap settings. See Tables 1-3 herein. The process would begin with taking one or two "sizing passes" to reach a predefined mill gap setting, then reducing the mill gap by a predetermined amount per pass. The change in mill gap setting with each roll pass can be held constant, increased sequentially, or increased incrementally. As the thickness of the work piece approaches the target thickness for the intermediate plate, the change in mill gap setting may be changed per the mill operator discretion in order to attain the desired intermediate plate width and thickness range.

Care must be taken to limit the amount of lateral spread of the work piece when rolling slab to intermediate plate. Lateral spreading can occur by taking flattening passes, so the number of flattening passes and the amount of strain imparted per flattening pass should be minimized. The total number of flattening passes can be from 1 to 20, or from 1 to 10, or from 1 to 5. Also, feeding of the work piece into the mill at an angle is not preferred. The use of a pusher bar to feed the work piece into the mill is desired.

As an option, after the first rolling, which can be, for instance, a broadside rolling(s), the dimensions in the direction of rolling will increase and in one or more embodiments, the dimensions in the direction of rolling will increase greatly. For instance, if the first rolling is in the direction of the width or along the width direction, the width can increase from 100% to 1,000% or more. This is strictly as an example. When the dimensions in the rolling direction have increased dramatically, as an option, the rolled slab or intermediate plate can then be optionally divided into two or more intermediate plates. As a further example, in the rolling direction wherein the dimensions that have increased, the intermediate plate can be divided into one-half or one-third or one-quarter, depending on the desired final dimensions of the final product. As a further example, the width can be about 50 inches after the first rolling, and after removing the edges, the intermediate plate can be cut such that the width for each cut intermediate plate is about 20 inches. Also, as an option, the front edge (or leading edge) and back edge (or trailing edge) of the plate that entered the rollers can be removed. Sometimes, these edges are called "pipe" due to the forming that occurs to the edges of the plate (front and back) during rolling. These "pipe" sections can be removed from the front edge and back edge, and sometimes can amount to 1% to 15% of the entire dimensions in the rolled direction. For instance, a width of about 40 inches can have 5 inches of "pipe" section removed on each edge. After the first rolling, the intermediate plate can be optionally heat treated or annealed using the conditions described later.

After the second optional rolling, as an option, the "pipe" section on the front edge, on the back edge, or both can be removed in the same manner as described above with respect to the "pipe" section occurring after the first rolling. Further, after the first and/or second rolling, the plate can be annealed in the manner described below. Also, the plate can be divided into desirable dimensions based on the final product. For instance, the material can be sheared or jet cut to size. Also, after any deforming step or prior to any deforming step, the metal, such as the slab or plate, can be leveled rolled in order to achieve a more uniform flatness across one or more surfaces of the metal such that the two opposing rolling surfaces are flat within 0.050 inch or less, such as 0.020 inch or less, or within 0.010 inch or less (e.g., within 0.001 inch to 0.050 inch, or within 0.005 inch to 0.020 inch).

Prior to and/or after: any deforming step and/or cleaning/washing step and/or dividing/cutting step, the metal can be annealed one or more times (e.g., 1, 2, 3, 4, or more times). Annealing is preferably achieved in a vacuum of $5 \times 10^{-4}$ torr or higher, and at a sufficient temperature and for a sufficient time to ensure recovery or complete recrystallization of the metal. Other annealing conditions can be used. The metal can be optionally annealed at a temperature from about 700-1500° C. or from about 850 to about 1500° C. for about 10 to 30 minutes or up to about 24 hours or more, and more preferably at a temperature of from about 1050 to about 1300° C. for 1-3 hours or more, to achieve stress relief, and/or partial or complete recrystallization, and preferably without excessive non-uniform grain growth or secondary recrystallization. Other times and temperatures can be used. The anneal temperature refers to the temperature within the oven or furnace.

An objective of rolling intermediate plate to finished plate can be to impart sufficient true strain per pass to attain homogeneous strain through the thickness of the plate to attain a fine and uniform grain structure and texture in the material after annealing. In at least one embodiment, it is desirable to impart a minimum of 0.06 true strain reduction (e.g., 0.06 to 0.19 or 0.06 to 0.18, 0.06 to 0.15, or 0.06 to 0.12) in each rolling pass in reducing the intermediate plate thickness to finished plate thickness. It is desirable that roll direction during the second reduction rolling process be perpendicular to the first rolling direction of the intermediate plate. However, straight rolling from slab to finished plate, or clock rolling of intermediate plate to finished plate is permissible.

Each intermediate plate can then be rolled (e.g., cold rolled) into finished plate of desired dimensions using a rolling schedule having a defined minimum true strain per pass. To assure process and product consistency from lot to lot, it is preferred that that the number of heavy reduction passes, and the allowable true strain reduction range of each pass be predefined (for example, as shown in Tables 1-3). Also, to prevent excessive curving of the plate after rolling, it is beneficial that the last rolling pass impart a true strain reduction greater than the prior rolling passes. An example of a schedule to roll intermediate plate to final product is as follows: intermediate plate lots having a thickness range of 0.4-1.00" can be rolled to a target gauge of 0.300" by five reduction passes of 0.06-0.22 true strain per pass or 0.06 to 0.18 true strain per pass.

At any point or stage, the slab, intermediate plate, and/or finished plate can be processed to have faces that are flat and parallel. It is preferred that the roll faces be processed in a manner that does not contaminate or embed foreign materials into the surface. Machining methods such as milling or fly cutting are a preferred method for making the rolling faces flat and parallel. Other methods such as grinding or lapping may be used (e.g., use of machines from Blanchard, Mattison, Gockel, or Reform), and subsequent cleaning operations, such as heavy pickling, may be used to remove, for instance, about 0.001" from all surfaces to remove any embedded contaminants.

At any point or stage, the slab, intermediate plate, and/or finished plate can then be cleaned to remove any foreign matter atop the surfaces such as oil and/or oxide residues. An acid pickle solution of hydrofluoric acid, nitric acid, and deionized water such as described in U.S. Pat. No. 6,348,113 would suffice. As stated, the slab, intermediate plate, and/or finished plate and/or metal article can be annealed in vacuum or an inert atmosphere, for instance, at a temperature between 700-1500° C. or 850-1500° C. for about 10-30 minutes or up to about 24 hours or more, and more preferably at a temperature of from about 1050 to about 1300° C. for 2-3 hours, to achieve stress relief, and/or partial or complete recrystallization without excessive non-uniform grain growth or secondary recrystallization.

Figure 3:
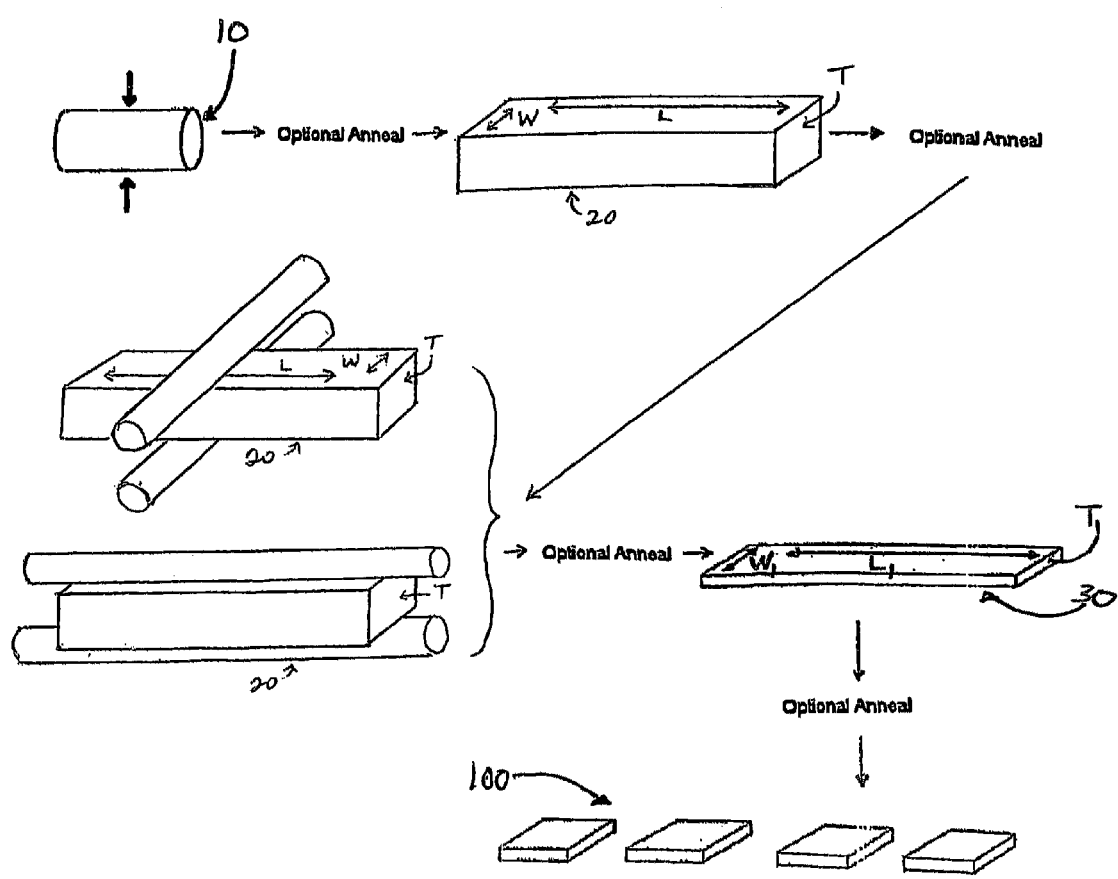
FIG. 3 is a schematic representation of a deformation process according to one embodiment of the present invention.

FIGS. 2 and 3 show several embodiments of the deformation of a metal ingot 10, for example, tantalum or niobium, to ultimately yield plates 100 according to several embodiments of the present invention. The metal ingot 10 can be first deformed, by forging, for example (e.g., as indicated by arrows) (press forging), to form a slab 20. The slab 20 can be in the shape of a rectangle having a first dimension L, a second dimension W normal to said first dimension L, and a third dimension T normal to the second dimension W, that can be within 15% of the second dimension W. The slab 20 can be optionally annealed as discussed. The slab 20 can optionally be divided into multiple slabs 25 having the W and T of slab 20 as shown in FIG. 2. The slab 20 (undivided) or divided 25, can be rolled in two directions (or more than two directions) to form an intermediate plate and then a finished plate 30. According to another embodiment, the deforming of the slab can be achieved by bloom rolling the slab, preferably using a bloom mill. The finished plate can be divided into multiple plates as shown in FIG. 3. Multidirectionally deforming the valve metal can be contrasted to transverse rolling of a slab in more than one direction, for example, as illustrated in FIGS.

1a and 1b. In a transverse rolling process, the metal workpiece 90 is rolled in a first direction (A), and then rolled in a second direction (B) that is perpendicular to the first direction (A), such that the length and width are increased while the smallest dimension (e.g., thickness) is decreased. Thus, transverse rolling has the effect of flattening a metal work piece to a desired thickness. Multidirectionally deforming also differs from redundant forging that restores or substantially restores a metal workpiece to a previous form, as shown, for example, in U.S. Patent Application Publication No. US2002/0112789 A1. The plate 30 or divided plates 100 can be further processed into sputter targets as described in U.S. Pat. No. 6,348, 113 B1 (Michaluk et al.) and in U.S. Patent Application Publication Nos. U.S. 2003/0037847 A1; 2003/0019746 A1; 2002/0157736 A1; 2002/0072475 A1; and 2002/002695 A1, incorporated in their entirety herein by reference. The sputter targets or target blanks can be, for example, planar or cylindrical (e.g., hollow cathode magnetron), and can further be bonded or attached to a backing plate.

FIG. 11 sets forth, as a specific example, the processing of the metal that can occur starting with the formation of the ingot from a green log by melting in a EB furnace (one or more times, such as two times) and then thereafter machine cleaning the ingot. The ingot can then be forged, subdivided, and then machine cleaned. The machine cleaned divided slab can then be broadside rolled and then the "pipe" sections can be removed. Further, the intermediate plate formed from the first rolling can be subdivided as shown. Then, the cut intermediate plates can be rotated and transverse rolled and afterwards the plate can be cut to size. Annealing can occur at any stage of this process, and FIG. 11 shows, for exemplary purposes only, various starting diameters, dimensions, and final dimensions, and percent reductions.

According to one embodiment of the present invention, the finished deformed metal article can have dimensions sufficient to be divided to form a plurality of sputter targets, and preferably one or more test or quality control samples. The finished metal article can be any shape, and is preferably substantially in the shape of a rectangle. For instance, the length can be from 12 inches to 50 inches or more, the width can be from 12 inches to 100 inches or more, and thickness can be from 0.1 to 1 inch or from 0.1 to 0.8 inch or from 0.1 to 0.5 inch. Preferably, the rectangle is 42 inches by 84 inches, 20 inches by 84 inches, or 24 inches by 36 inches. Preferably, the metal has a nominal thickness of from about 0.1 to about 0.8 inches, and more preferably, from about 0.25 to about 0.46 inches.

Deformation of a valve metal according to at least one embodiment of the present invention can produce a slab having an average grain size of less than about 250 microns and/or a texture that is substantially void of (100) textural bands or other (x y z) textural bands. The slab preferably has an average grain size of from about 5 to 100 microns or from about 20 to about 150 microns, or more preferably of 50 microns or less. The average grain size can be from 5 to 75 microns, or from 5 to 50 microns, or from 5 to 35 microns, or from 5 to 25 microns, or from 5 to 20 microns.

At least one embodiment of the present invention, the method further involves partitioning the slab, rolled slab, plate and/or finished plate that can then be further thermo and/or mechanically processed. Partitioning can be achieved by separating the slab, rolled slab or plate or finished plate into a predetermined number of rolling pieces. Partitioning can be by, for example, cutting, machining, waterjet cutting, punch pressing, plasma cutting, flame cutting, milling, grinding, sawing, laser cutting, boring, electrode discharge machining, or any combination thereof. One or more of the divided pieces can be particularly sized for use as a test or a quality control sample.

Further, the present invention relates to a method of producing high purity metal plates (or other types of metal plates), optionally of sufficient size to yield a plurality of sputtering target blanks or components. Preferably, the resulting metal, for instance, finished plate, (e.g., tantalum) has a fine, uniform microstructure. The average grain size can be from 5 to 75 microns, or from 5 to 50 microns, or from 5 to 35 microns, or from 5 to 25 microns, or from 5 to 20 microns. For example, the resulting metal, such as the valve metal, can have an average grain size of about 150 microns or less, or about 75 microns or less, or 50 microns or less, such as 18 microns or less, or 15 microns or less, and/or a texture that is substantially void of texture bands, like, e.g., (100) texture bands or other (x y z) texture bands. The resulting metal can be devoid or substantially devoid of texture gradients. The resulting metal can be substantially void of unrecrystallized bands. The resulting metal can have a uniform texture on the surface and/or throughout the thickness, such as (100), (111), mixed textures, like (111):(100), and the like. The texture can be a primary texture, such as a primary (111), or a primary (100) texture, or a mixed (111) (100) texture, wherein all of which are preferably uniform on the surface and/or throughout the thickness. The texture can be random, such as a uniform random (or non-dominate) texture, preferably through the thickness. The randomness can have any ratio of texture that is preferably substantially consistent throughout the metal. For purposes of the present invention, tantalum metal is discussed throughout the present application for strictly exemplary purposes, realizing that the present invention equally applies to other metals, including other valve metals (e.g., niobium) and other metals and alloys thereof.

With respect to the slab, intermediate plate, finished plates, metal articles and/or the sputtering target, and any other components including the ingot, these materials can have any purity with respect to the metal present. For instance, the purity can be 95% or higher, such as at least 99%, at least 99.5%, at least 99.9%, at least 99.95%, at least 99.99%, at least 99.995% or at least 99.999% pure with respect to the metal present, such as from 99.95% to 99.99995% or from 99.99% to 99.999%, where the % refers to metal and lack of metal impurities. For instance, these purities would apply to a tantalum metal slab, wherein the slab would be 99% pure tantalum and so on with respect to the higher purities. The metal article or finished plate can have any combination of metal purity, texture, and/or gram size recited herein. Furthermore, the starting ingot or slab can have any average grain size such as 2000 microns or less and more preferably 1000 microns or less and more preferably 500 microns or less even more preferably 150 microns or less.

Furthermore, with respect to the texture of the starting slab or the ingot in which the slab is typically made from, as well as the other subsequent components resulting from the working of the slab such as the intermediate plate, the texture can be any texture such as a primary (100) or primary (111) texture or a mixed (111):(100) texture (or other mixed and/or random textures) on the surface and/or throughout the thickness of the material, such as the slab. Preferably, the material, such as the slab, does not have any textural banding, such as (100) textural banding when the texture is a primary (111) or mixed (111):(100) texture.

In one embodiment of the present invention, the product resulting from the process of the present invention preferably results in plates or metal articles, like sputter targets wherein at least 95% of all grains present are 100 microns or less, or 75 microns or less, or 50 microns or less, or 35 microns or less, or 25 microns or less, at 95% of all grains present. The average grain size can be from 5 to 75 microns, or from 5 to 50 microns, or from 5 to 35 microns, or from 5 to 25 microns, or from 5 to 20 microns. More preferably, the product resulting from the process of the present invention results in plates or sputter targets wherein at least 99% of all grains present are 100 microns or less or 75 microns or less or 50 microns or less and more preferably 35 microns or less and even more preferably 25 microns or less, such as the average grain size can be from 5 to 75 microns, or from 5 to 50 microns, or from 5 to 35 microns, or from 5 to 25 microns, or from 5 to 20 microns. Preferably, at least 99.5% of all grains present have this desired grain structure and more preferably at least 99.9% of all grains present have this grain structure, that is 100 microns or less, 75 microns or less, 50 microns or less and more preferably 35 microns or less and even more preferably 25 microns or less, such as the average grain size can be from 5 to 75 microns, or from 5 to 50 microns, or from 5 to 35 microns, or from 5 to 25 microns, or from 5 to 20 microns. The determination of this high percentage of low grain size is preferably based on measuring 500 grains randomly chosen on a microphotograph showing the grain structure. The average grain size of the plate and/or metal article can be about 150 microns or less, such as from about 5 to about 100 microns, or from about 10 microns to about 75 microns.

Preferably, the valve metal plate has a primary (111) or primary (100) or a mixed (111) (100) texture on the surface and/or a transposed primary (111), a transposed primary (100) or a mixed transposed (111) (100) throughout its thickness.

In addition, the plate (as well as the sputter target) are preferably produced wherein the product is substantially free of marbleizing on the surface of the plate or target. The substantially free of marbleizing preferably means that 25% or less of the surface area of the surface of the plate or target does not have marbleizing, and more preferably 20% or less, 15% or less, 10% or less, 5% or less, 3% or less, or 1% or less of the surface area of the surface of the plate or target does not have marbleizing. The marbleizing can be a patch or large banding area which contains texture that is different from the primary texture. For instance, when a primary (111) texture is present, the marbleizing in the form of a patch or large banding area will typically be a (100) texture area which is on the surface of the plate or target and may as well run throughout the thickness of the plate or target. This patch or large banding area can generally be considered a patch having a surface area of at least 0.25% of the entire surface area of the plate or target and may be even larger in surface area such as 0.5% or 1%, 2%, 3%, 4%, or 5% or higher with respect to a single patch on the surface of the plate or target. There may certainly be more than one patch that defines the marbleizing on the surface of the plate or target. Using the non-destructive banding test referred to above in U.S. Patent Application No. 60/545,617, the present application can confirm this quantitatively. Further, the plate or target can have banding (% banding area) of 1% or less, such as 0.60 to 0.95%. The present invention serves to reduce the size of the individual patches showing marbleizing and/or reduces the number of overall patches of marbleizing occurring. Thus, the present invention minimizes the surface area that is affected by marbleizing and reduces the number of marbleizing patches that occur. By reducing the marbleizing on the surface of the plate or target, the plate or target does not need to be subjected to further working of the plate or target and/or further annealing. In addition, the top surface of the plate or target does not need to be removed in order to remove the marbleizing effect. Thus, by way of the present invention, less physical working of the plate or target is needed thus resulting in labor cost as well as savings with respect to loss of material. In addition, by providing a product with less marbleizing, the plate and more importantly, the target can be sputtered uniformly and without waste of material.

The metal plate of the present invention can have a surface area that has less than 75%, such as less than 50% or less than 25%, of lusterous blotches after sputter or chemical erosion, such as 0.5% to 50%, or 0.75% to 25% or 0.50% to 15%. Preferably, the surface area has less than 10% of lusterous blotches after sputter or chemical erosion. More preferably, the surface area has less than 5% of lusterous blotches, and most preferably, less than 1% of lusterous blotches after sputter or chemical reacting.

For purposes of the present invention, the texture can also be a mixed texture such as a (111):(100) mixed texture and this mixed texture is preferably uniform throughout the surface and/or thickness of the plate or target. The various uses including formation of thin films, capacitor cans, capacitors, and the like as described in U.S. Pat. No. 6,348,113 can be achieved here and to avoid repeating, these uses and like are incorporated herein. Also, the uses, the grain sizes, texture, purity that are set forth in U.S. Pat. No. 6,348,113 can be used herein for the metals herein and are incorporated herein in their entirety.

The metal plate of the present invention can have an overall change in pole orientation ($\Omega$). The overall change in pole orientation can be measured through the thickness of the plate in accordance with U.S. Pat. No. 6,462,339. The method of measuring the overall change in pole orientation can be the same as a method for quantifying the texture homogeneity of a polycrystalline material. The method can include selecting a reference pole orientation, scanning in increments a cross-section of the material or portion thereof having a thickness with scanning orientation image microscopy to obtain actual pole orientations of a multiplicity of grains in increments throughout the thickness, determining orientation differences between the reference pole orientation and actual pole orientations of a multiplicity of grains in the material or portion thereof, assigning a value of misorientation from the references pole orientation at each grain measured throughout the thickness, and determining an average misorientation of each measured increment throughout the thickness; and obtaining texture banding by determining a second derivative of the average misorientation of each measured increment through the thickness. Using the method described above, the overall change in pole orientation of the metal plate of the present invention measured through the thickness of the plate can be less than about 50/mm. Preferably, the overall change in pole orientation measured through the thickness of the plate of the present invention, in accordance to U.S. Pat. No. 6,462,339 is less than about 25/mm, more preferably, less than about 10/mm, and, most preferably, less than about 5/mm, such as from 1/mm to 49/mm or from 1/mm to 25/mm or from 1/mm to 10/mm.

The metal plate of the present invention, can have a scalar severity of texture inflection ($\Lambda$) measured through the thickness of the plate in accordance with U.S. Pat. No. 6,462,339. The method can include selecting a reference pole orientation, scanning in increments a cross-section of the material or portion thereof having a thickness with scanning orientation image microscopy to obtain actual pole orientations of a multiplicity of grains in increments throughout the thickness, determining orientation differences between the reference pole orientation and actual pole orientations of a multiplicity of grains in the material or portion thereof, assigning a value of misorientation from the references pole orientation at each grain measured throughout said thickness, and determining an average misorientation of each measured increment throughout the thickness; and determining texture banding by determining a second derivative of the average misorientation of each measured increment through the thickness. The scalar severity of texture inflection of the metal plate of the present invention measured through the thickness of the plate can be less than about 5/mm. Preferably, the scalar severity of texture inflection measured through the thickness of the plate in accordance with U.S. Pat. No. 6,462,339 is less than about 4/mm, more preferably, less than about 2/mm, and, most preferably, less than about 1/mm, such as from 0.1/mm to 4.9/mm, or from 0.5/mm to 3.9/mm, or from 0.5/mm to 1.9/mm.

In at least one embodiment of the present invention, the metal plate or metal article of the present invention can have a texture gradient that is very low. For example, the texture gradient can be measured with respect to the heterogeneity and the banding of the metal plate as calculated using the "Scalar Measures of Texture Heterogeneity" as published in the *Proceedings of ICOTOM* 14 (2005) by Wright, S. I. and D. F. Field. This is further discussed in the Materials Science Forum, Vols. 495-497, September 2005, pgs. 207-212. This texture gradient is based on the method described in these publications using automated EBSD or orientation imaging microscropy (OIM). For purposes of the present invention, and in at least one embodiment, the uniformity factor (H), has a value of 0.3 or less or 0.2 or less, such as from 0.05 to 0.2, or from 0.12 to 0.175, or from about 0.13 to about 0.16. In at least one embodiment, the metal plate or metal article of the present invention can have a banding factor (B) of 0.1 or less, such as from about 0.01 to about 0.075, or from about 0.02 to about 0.05, or from about 0.03 to about 0.04.

Figure 12:
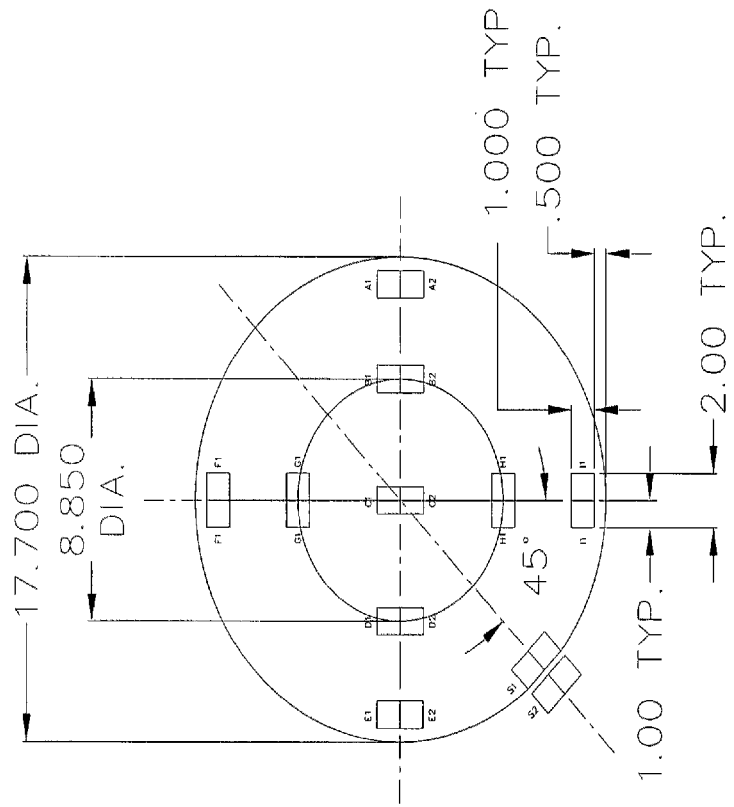
FIG. 12 is a drawing of a metal article, such as a disc, which further shows desirable locations to take samples of the metal article to measure texture and/or grain size to gain a full understanding of the metal article throughout on all planes (x,y,z).

In one or embodiments of the present invention, the uniformity factor (H) can vary no more than 0.2 throughout the metal plate or metal article, such as no more than 0.1, or no more than 0.05, or no more than 0.01, or no more than 0.005, or no more than 0.001. The uniformity factor (H) can vary from 0.001 to 0.05 or can vary from 0.01 to 0.15, or can vary from 0.01 to 0.2 throughout the metal plate or article. In one or more embodiments of the present invention, the banding factor (B) can vary no more than 0.05, such as no more than 0.04, or no more than 0.03, or no more than 0.02, or no more than 0.01. The banding factor (B) can vary from 0.005 to 0.05 or can vary from 0.01 to 0.04, or can vary from 0.01 to 0.03, or can vary no more than 0.01 to 0.025 throughout the metal plate or metal article. In one or more embodiments of the present invention, the degree random or times random of the texture throughout the metal plate or metal article can vary no more than 5 degrees or times random, such as no more than 4 degrees or times random, or no more than 2 degrees or times random, or 1 degree or times random. The degree or times random can vary from 1 degree or times random to 5 degrees or times random, or from 1 degree or times random to 4 degrees or times random, or from 1 degree or times random to 3 degrees times random or from 1 degree or times random to 2 degrees times random throughout the metal plate or metal article. The "degree(s) or times random" refers to a numerical amount wherein a particular texture (e.g., (111) or (100) or mixed texture) is present in the specified amount greater than random. In measuring this controlled uniformity of the metal plate or metal article, 10 samples can be taken across the metal plate or metal article, as shown in FIG. 12 to determine, for each sample, the (H), (B), degree random, crystal direction map, and/or average grain size. In FIG. 12, only one of S1 or S2 is used as one of the 10 samples. While FIG. 12 shows a disc shape, similar locations for other metal articles can be followed in the same manner. These 10 samples reflect an understanding of the metal article or metal plate with respect to through thickness for each of the 10 samples and further represents a complete understanding of the across the planes that are perpendicular to the thickness. Thus, this test provides a very complete understanding of the metal on every plane (x,y,z) of the metal plate or article.

In one or more embodiments of the present invention, the metal plate or metal article can have a primary texture that is at least 7 degrees or times more than random, such as from 7 to 25 (or more) degrees or times more than random, from 8 to 20 degrees or times more than random or 10 to 15 degrees or times more than random, throughout the metal plate or metal article, preferably using the 10 sample locations in FIG. 12.

The metal plate or metal article of the present invention can have the uniformity factor in connection with the banding factor or just one of these factors alone. The uniformity factor and/or banding factor can be present independent of or along with the purity, texture, and/or grain size recited herein. Thus, a metal can have one or more of these characteristics. The (H) and (B) factors can be for any texture or primary texture, such as (111), (100), or mixed textures, like (111:100). Preferably, with respect to all of the above characteristics of the metal (e.g., grain size, texture, (H), (B), and/or purity), the preferred metal is tantalum, niobium, or alloys thereof.

The present invention will be further clarified by the following examples, which are intended to be purely exemplary of the present invention. The true strain in % in the Tables can be converted by dividing by 100 to obtain the units used in the present specification above.

EXAMPLES

Examples: Tantalum ingots were formed into slabs using press forging steps to obtain the starting dimensions $W_s=5\frac{1}{2}$, $L_s$=as in Table 1, and $T_s=5.25"$ nominal. The slabs were cut into multiple slabs (up to 6) so that the cut slab length was 27 inches. The cut slabs were then machine cleaned. The slabs were then annealed at 1050° C. for 3 hrs. in a vacuum furnace. Table 1 also provides the desired final product size once it is cut from the finished plate. The slab was then subjected to a first rolling (broad side rolling) in the direction of W in FIG. 3 or A in FIG. 1a. The roll schedule for the first rolling of the various slabs is set forth in Table 2. After the first rolling, the rolled slab was cut/divided by cutting the width in half. Also, the leading edge and trailing edge that went through the rolling were trimmed off. The cut-rolled slab was then annealed for some of the samples as indicated. The "Intermediate Plate" represents the plate after the first rolling passes and before the second rolling. After the first rolling, the intermediate plate from each of the slabs had the following dimensions: $L_i=L_s\pm5$ to 10%, $W_i$=see Table 3, and $T_i$=see Table 3. Then, the intermediate plate was subjected to a second rolling which was traverse to the first rolling direction. The second rolling direction was in the direction of L in FIG. 3 or B in FIG. 1b.

The second rolling schedule along with other information is in Table 4 (30 plate samples). After the second rolling, the leading edge of the rolled slab was trimmed. Then, the Intermediate Plate that was trimmed was level rolled to obtain a more uniform flatness. All distance measurements are in inches. The Actual Mill Stretch is the estimated measurement or "give" of the mill during rolling. The separating force is the amount of force applied during each rolling pass and is a percentage of 2,500 tons. Each "start thickness" represents a pass through the mill rolls. After the second rolling, the finished tantalum plate was again annealed at 1050° C. for two hours in a vacuum furnace. The actual post pass thickness and actual mill stretch are the result of measurements resulting from the rolling steps. The reduction in thickness signifies a rolling step which was a cold rolling step.

TABLE 1

| Cut Slab Length | |
|---|---|
| Finished Disc Size | Slab Length (Ls) |
| 0.250" × 12.7" | 28" |
| 0.250" × 17.7" | 30" |
| 0.300" × 12.7" | 27" |
| 0.300" × 17.7" | 27" |

TABLE 2

Broadside Roll Schedule:

| Pass | Mill Setting | Pass | Mill Setting | Pass | Mill Setting | Pass | Mill Setting | Pass | Mill Setting |
|---|---|---|---|---|---|---|---|---|---|
| 1 | 5.5 | 11 | 4.5 | 21 | 3.5 | 31 | 2.5 | 41 | 1.36 |
| 2 | 5.4 | 12 | 4.4 | 22 | 3.4 | 32 | 2.4 | 42 | 1.23 |
| 3 | 5.3 | 13 | 4.3 | 23 | 3.3 | 33 | 2.3 | 43 | 1.1 |
| 4 | 5.2 | 14 | 4.2 | 24 | 3.2 | 34 | 2.2 | 44 | 0.97 |
| 5 | 5.1 | 15 | 4.1 | 25 | 3.1 | 35 | 2.1 | 45 | 0.84 |
| 6 | 5.0 | 16 | 4.0 | 26 | 3.0 | 36 | 2.0 | 46 | As req. |
| 7 | 4.9 | 17 | 3.9 | 27 | 2.9 | 37 | 1.9 | | |
| 8 | 4.8 | 18 | 3.8 | 28 | 2.8 | 38 | 1.8 | | |
| 9 | 4.7 | 19 | 3.7 | 29 | 2.7 | 39 | 1.65 | | |
| 10 | 4.6 | 20 | 3.6 | 30 | 2.6 | 40 | 1.51 | | |

TABLE 3

Broadside Rolling Output

| Parameter | 0.250" $(T_f) \times$ 12.7" | 0.250" $(T_f) \times$ 17.7" | 0.300" $(T_f) \times$ 12.7" | 0.300" $(T_f) \times$ 17.7" |
|---|---|---|---|---|
| Target Thickness after Broadside Passes ($T_i$) | 0.720 | 0.568 | 0.722" | 0.569" |
| Good Width (Broadside) (Wi) | 27.5" | 37.5" | 27.5" | 37.5" |
| No. of Sheared Plates for Length Roll | 2 | 2 | 2 | 2 |
| $L_f$ | 79" | 67" | 65" | 48" |
| Width of Sheared Plate | 13.75" | 18.75" | 13.7" | 18.7" |
| | $L_i = L_s \pm 10\%$ - for all | | | |
| | $W_f = W_i \pm 5\text{–}10\%$ for all | | | |
| No of discs obtained from the finished plate | 5 | 3 | 4 | 2 |

TABLE 4

| Pass | Start Dimension | True Strain | Predicted End Dimension | Reduction | Calc. mill gap | Actual Mill Stretch | measured post pass thickness | Actual true strain | Material Reduction |
|---|---|---|---|---|---|---|---|---|---|
| Single Wide - .300 × 17.7, low ε 275631D2 |||||||||||
| 1 | 0.521 | −13.00% | 0.457 | 0.064 | 0.392 | 0.088 | 0.48 | 0.08 | 0.041 |
| 2 | 0.457 | −13.00% | 0.402 | 0.056 | 0.337 | 0.080 | 0.417 | 0.14 | 0.063 |
| 3 | 0.402 | −13.00% | 0.353 | 0.049 | 0.288 | 0.074 | 0.362 | 0.14 | 0.055 |
| 4 | 0.353 | −13.00% | 0.310 | 0.043 | 0.244 | 0.073 | 0.317 | 0.13 | 0.045 |
| Single Wide - .300 × 12.7, High ε 275631C2 |||||||||||
| 1 | 0.708 | −27.00% | 0.540 | 0.168 | 0.404 | 0.114 | 0.518 | 0.31 | 0.190 |
| 2 | 0.540 | −27.00% | 0.413 | 0.128 | 0.300 | 0.109 | 0.409 | 0.24 | 0.109 |
| 3 | 0.413 | −27.00% | 0.315 | 0.098 | 0.219 | 0.109 | 0.328 | 0.22 | 0.081 |
| Single Wide - .300 × 12.7, low ε 275631A2 |||||||||||
| 1 | 0.722 | −14.00% | 0.628 | 0.094 | 0.545 | 0.085 | 0.63 | 0.14 | 0.092 |
| 2 | 0.628 | −14.00% | 0.546 | 0.082 | 0.467 | 0.083 | 0.55 | 0.14 | 0.080 |
| 3 | 0.546 | −14.00% | 0.474 | 0.071 | 0.399 | 0.078 | 0.477 | 0.14 | 0.073 |
| 4 | 0.474 | −14.00% | 0.412 | 0.062 | 0.338 | 0.072 | 0.41 | 0.15 | 0.067 |
| 5 | 0.412 | −14.00% | 0.359 | 0.054 | 0.285 | 0.065 | 0.35 | 0.16 | 0.060 |
| 6 | 0.359 | −14.00% | 0.312 | 0.047 | 0.238 | 0.063 | 0.301 | 0.15 | 0.049 |
| Single Wide - .250 × 12, High ε 275631F2 |||||||||||
| 1 | 0.735 | −26.00% | 0.567 | 0.168 | 0.430 | 0.112 | 0.542 | 0.30 | 0.193 |
| 2 | 0.567 | −26.00% | 0.437 | 0.130 | 0.324 | 0.106 | 0.43 | 0.23 | 0.112 |
| 3 | 0.437 | −26.00% | 0.337 | 0.100 | 0.240 | 0.107 | 0.347 | 0.21 | 0.083 |
| 4 | 0.337 | −26.00% | 0.260 | 0.077 | 0.175 | 0.095 | 0.27 | 0.25 | 0.077 |
| Single Wide - .250 × 12, low ε 275631B2 |||||||||||
| 1 | 0.715 | −15.00% | 0.615 | 0.100 | 0.529 | | | | |
| 2 | 0.615 | −15.00% | 0.530 | 0.086 | 0.449 | | | | |
| 3 | 0.530 | −15.00% | 0.456 | 0.074 | 0.378 | 0.064 | 0.442 | | |
| 4 | 0.456 | −15.00% | 0.392 | 0.064 | 0.317 | 0.072 | 0.389 | 0.13 | 0.053 |
| 5 | 0.392 | −14.00% | 0.341 | 0.051 | 0.270 | 0.075 | 0.345 | 0.12 | 0.044 |
| 6 | 0.341 | −14.00% | 0.297 | 0.045 | 0.225 | 0.066 | 0.291 | 0.17 | 0.054 |
| 7 | 0.297 | −14.00% | 0.258 | 0.039 | 0.185 | 0.070 | 0.255 | 0.13 | 0.036 |

TABLE 4-continued

| Pass | Start Dimension | True Strain | Predicted End Dimension | Reduction | Calc. mill gap | Actual Mill Stretch | measured post pass thickness | Actual true strain | Material Reduction |
|---|---|---|---|---|---|---|---|---|---|
| | | | Single Wide - .300 × 17.7, High ε 275631G2 | | | | | | |
| 1 | 0.523 | −25.00% | 0.407 | 0.116 | 0.304 | 0.126 | 0.43 | 0.20 | 0.093 |
| 2 | 0.407 | −25.00% | 0.343 | 0.064 | 0.272 | 0.049 | 0.321 | 0.29 | 0.109 |
| | | | Single Wide - .250 × 17.75, low ε 279508-A1 | | | | | | |
| 1 | 0.490 | −13.00% | 0.430 | 0.060 | 0.330 | 0.099 | 0.429 | 0.13 | 0.061 |
| 2 | 0.430 | −13.00% | 0.378 | 0.052 | 0.281 | 0.094 | 0.375 | 0.13 | 0.054 |
| 3 | 0.378 | −13.00% | 0.332 | 0.046 | 0.237 | 0.091 | 0.328 | 0.13 | 0.047 |
| 4 | 0.332 | −14.00% | 0.295 | 0.037 | 0.200 | 0.086 | 0.286 | 0.14 | 0.042 |
| 5 | 0.295 | −14.00% | 0.258 | 0.037 | 0.185 | 0.073 | 0.258 | 0.10 | 0.028 |
| | | | Single Wide - .250 × 17.75, low ε 279739-B2 | | | | | | |
| 1 | 0.486 | −13.00% | 0.427 | 0.059 | | | 0.457 | 0.06 | 0.029 |
| 2 | 0.457 | −13.00% | 0.408 | 0.049 | 0.315 | 0.093 | 0.408 | 0.11 | 0.049 |
| 3 | 0.408 | −13.00% | 0.358 | 0.050 | 0.275 | 0.100 | 0.375 | 0.08 | 0.033 |
| 4 | 0.375 | −14.00% | 0.326 | 0.049 | 0.245 | 0.090 | 0.335 | 0.11 | 0.040 |
| 5 | 0.335 | −14.00% | 0.291 | 0.044 | 0.160 | 0.117 | 0.277 | 0.19 | 0.058 |
| | | | Single Wide - .300 × 12.7, High ε 275631C1 Annealed Int. Plate | | | | | | |
| 1 | 0.829 | −25.00% | 0.646 | 0.183 | 0.518 | 0.070 | 0.588 | 0.34 | 0.241 |
| 2 | 0.646 | −25.00% | 0.503 | 0.143 | 0.399 | 0.072 | 0.471 | 0.22 | 0.117 |
| 3 | 0.503 | −25.00% | 0.392 | 0.111 | 0.316 | 0.072 | 0.388 | 0.19 | 0.083 |
| 4 | 0.392 | −25.00% | 0.305 | 0.087 | 0.232 | 0.079 | 0.311 | 0.22 | 0.077 |
| | | | Single Wide - .300 × 12.7, low ε 275631A1 Annealed Int. Plate | | | | | | |
| 1 | 0.722 | −14.00% | 0.628 | 0.094 | 0.570 | 0.052 | 0.622 | 0.15 | 0.100 |
| 2 | 0.628 | −14.00% | 0.546 | 0.082 | 0.492 | 0.048 | 0.54 | 0.14 | 0.082 |
| 3 | 0.546 | −14.00% | 0.474 | 0.071 | 0.419 | 0.052 | 0.471 | 0.14 | 0.069 |
| 4 | 0.474 | −14.00% | 0.412 | 0.062 | 0.358 | 0.048 | 0.406 | 0.15 | 0.065 |
| 5 | 0.412 | −14.00% | 0.359 | 0.054 | 0.305 | 0.050 | 0.355 | 0.13 | 0.051 |
| 6 | 0.359 | −14.00% | 0.312 | 0.047 | 0.258 | 0.050 | 0.308 | 0.14 | 0.047 |
| | | | Single Wide - .250 × 12, High ε 275631F1 Annealed Int. Plate | | | | | | |
| 1 | 0.735 | −26.00% | 0.567 | 0.168 | 0.450 | 0.108 | 0.558 | 0.28 | 0.177 |
| 2 | 0.567 | −26.00% | 0.437 | 0.130 | 0.344 | 0.086 | 0.43 | 0.26 | 0.128 |
| 3 | 0.437 | −26.00% | 0.337 | 0.100 | 0.260 | 0.084 | 0.344 | 0.22 | 0.086 |
| 4 | 0.337 | −26.00% | 0.260 | 0.077 | 0.185 | 0.086 | 0.271 | 0.24 | 0.073 |
| | | | Single Wide - .250 × 12, low ε 275631B1 Annealed Int. Plate | | | | | | |
| 1 | 0.715 | −15.00% | 0.615 | 0.100 | 0.560 | 0.055 | 0.615 | 0.15 | 0.100 |
| 2 | 0.615 | −15.00% | 0.530 | 0.086 | 0.479 | 0.051 | 0.53 | 0.15 | 0.085 |
| 3 | 0.530 | −15.00% | 0.456 | 0.074 | 0.399 | 0.053 | 0.452 | 0.16 | 0.078 |
| 4 | 0.456 | −15.00% | 0.392 | 0.064 | 0.338 | 0.052 | 0.39 | 0.15 | 0.062 |
| 5 | 0.392 | −14.00% | 0.341 | 0.051 | 0.290 | 0.050 | 0.34 | 0.14 | 0.050 |
| 6 | 0.341 | −14.00% | 0.297 | 0.045 | 0.245 | 0.050 | 0.295 | 0.14 | 0.045 |
| 7 | 0.297 | −14.00% | 0.258 | 0.039 | 0.206 | 0.052 | 0.258 | 0.13 | 0.037 |
| | | | Single Wide - .300 × 17.7, High ε 275631G1 Annealed Int. Plate | | | | | | |
| 1 | 0.505 | −25.00% | 0.393 | 0.112 | 0.293 | 0.100 | 0.393 | 0.25 | 0.112 |
| 2 | 0.393 | −25.00% | 0.306 | 0.087 | 0.219 | 0.095 | 0.314 | 0.22 | 0.079 |
| | | | Single Wide - .300 × 17.7, low ε 275631D1- Annealed Int. Plate A | | | | | | |
| 1 | 0.521 | −13.00% | 0.457 | 0.064 | 0.422 | 0.057 | 0.479 | 0.08 | 0.042 |
| 2 | 0.457 | −13.00% | 0.402 | 0.056 | 0.352 | 0.071 | 0.423 | 0.12 | 0.056 |
| 3 | 0.402 | −13.00% | 0.353 | 0.049 | 0.298 | 0.072 | 0.37 | 0.13 | 0.053 |
| 4 | 0.353 | −13.00% | 0.310 | 0.043 | 0.244 | 0.072 | 0.316 | 0.16 | 0.054 |
| | | | Single Wide - .300 × 17.7, low ε 275631D1- Clock Roll Annealed Int. Plate B | | | | | | |
| 1 | 0.521 | −13.00% | 0.457 | 0.064 | 0.392 | 0.060 | 0.452 | 0.14 | 0.069 |
| 2 | 0.457 | −13.00% | 0.402 | 0.056 | 0.337 | 0.047 | 0.384 | 0.16 | 0.068 |
| 3 | 0.402 | −13.00% | 0.353 | 0.049 | 0.288 | 0.039 | 0.327 | 0.16 | 0.057 |

The tantalum plate formed in one of the examples above, namely from Table 4, Sample 275631D2, was then subjected to an electron back scatter detraction analysis to provide spatially specific measurements of crystallographic orientation and to measure texture heterogeneities for a tantalum plate made by the present invention. FIGS. 4-10 provide the data obtained for this tantalum plate. In particular, FIG. 4 provides an orientation color coded map and inverse pole figure for the tantalum plate from Table 4. The scanning was done every 10 microns, and the color coded map has been pieced together to show the through thickness of the tantalum plate. As can be seen, the (111) orientation is indicated by blue, while the (001) or (100) is indicated by red, and the (101) is indicated by a greenish tint. Viewing the color coded map, it is clear that the primary texture is a (111) texture throughout the thickness of the tantalum plate, and that this (111) texture is the dominant texture and is quite uniform throughout the thickness of the plate. There is some evidence of (100) textures, which are in the minority with respect to overall texture. FIG. 5 provides a crystal direction map with a 5 degree tolerance for purposes of detecting the various textures. As can be seen with a 5 degree tolerance, the primary texture with a 5 degree tolerance is (111) with very minor amounts of (100). With respect to the crystal direction map with a 10 degree tolerance, namely FIG. 6, and a crystal direction map with a 15 degree tolerance, namely FIG. 7, again, it can be seen that the primary texture is clearly (111) with minor amounts of (100) and essentially no (101). FIGS. 8 and 9 provide pole figure plots and inverse pole figure plots, respectively, for the tantalum plate from Table 4 (Sample 275631 D2). As can be seen from these plots, there is a high degree of (111) and far lesser amounts of (100) and extremely low amounts of (101). Finally, FIG. 10 provides a grain size histrogram showing that the average grain size is about 50 microns with a standard deviation of 26 microns. Again, all of this data is with respect to the tantalum plate obtained in Table 4. Finally, with respect to the tantalum plate obtained in Table 4, the texture heterogeneity was measured using uniformity factor (H) and banding factor (B) as described and calculated in "Scaler Measures of Texture Heterogeneity" by Wright et al., as discussed earlier, and as further described in the *Proceedings of ICOTOM* 14 (2005). Based on this test method and standard, the tantalum plate of Table 4 had a uniformity factor (H) of 0.16 and a banding factor (B) of 0.04. The Texture Gradient is a metric describing how homogeneously/heterogeneously the local texture is distributed within the scan area. A second metric is also displayed which gives an idea whether the texture consists of alternating bands. The texture variations are assumed to vary horizontally or vertically. Only one phase can be inspected at a time. The actual mathematics behind the calculations are reported in: Wright, S. I. and D. P. Field (2005). "Scalar Measures of Texture Heterogeneity" published in *Proceedings of ICOTOM* 14 and held in Leuven, Belgium, July 2005. H is the measure describing the heterogeneity and ranges in value from 0 for a perfectly homogeneous distribution of the texture and 1 for a heterogeneous structure. Similarly, B describes the banding and a value of 0 denotes no banding whereas a value of 0.5 would describe an extreme banded case as shown for the idealized microstructures. Accordingly, the tantalum plate of the present invention had excellent low banding and excellent texture uniformity throughout the thickness of the metal plate, as well as very acceptable average grain size.

In one of the metal plates made in the present application, using the sample location set forth in FIG. 12, ten samples were analyzed with respect to the uniformity factor (H), the banding factor (B), and the degree or times random with respect to (111) texture. As can be seen from these ten samples taken from the same metal plate, the uniformity with respect to texture and the uniformity with respect to lack of banding was remarkable. The uniformity factor (H) was 0.3 or lower and, in many cases, was 0.2±0.05, and the banding factor (B) was uniformly low and was 0.05 or lower and many times 0.03±0.02. Furthermore, the degrees or times random with respect to the texture was quite uniform and 7.3 or higher, and not exceeding 8.9. Thus, the degrees or times random was within a considerably tight range and therefore showed uniformity as well.

| | CSB Summary ESBD Data | | |
|---|---|---|---|
| Sample ID | Deg Random | H | B |
| 1 | 7.5 | 0.19 | 0.05 |
| 2 | 7.7 | 0.17 | 0.03 |
| 3 | 8.2 | 0.22 | 0.05 |
| 4 | 7.7 | 0.20 | 0.03 |
| 5 | 8.8 | 0.30 | 0.01 |
| 6 | 8.8 | 0.21 | 0.03 |
| 7 | 8.2 | 0.24 | 0.02 |

-continued

| | CSB Summary ESBD Data | | |
|---|---|---|---|
| Sample ID | Deg Random | H | B |
| 8 | 7.3 | 0.21 | 0.03 |
| 9 | 8.9 | 0.22 | 0.03 |
| 10 | 7.9 | 0.26 | 0.03 |

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The claims show additional embodiments of the present invention. Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of making a metal article having a final thickness comprising:
    deforming a metal ingot to form a rectangular slab having a length, width, and thickness, wherein two of the three dimensions are within 25% of each other;
    a first rolling of said rectangular slab to form an intermediate plate, wherein said first rolling includes a plurality of rolling passes; and
    a second rolling of said intermediate plate to form a metal plate, wherein said second rolling includes a plurality of rolling passes, and wherein each of said rolling passes of said second rolling imparts a true strain reduction of from about 0.06 to 0.18 per pass.

2. The method of claim 1, wherein said two of three dimensions are within 15% of each other.

3. The method of claim 1, wherein said two of three dimensions are within 10% of each other.

4. The method of claim 1, wherein said two of three dimensions are within 1% of each other.

5. The method of claim 1, wherein said two of three dimensions are width and thickness.

6. The method of claim 1, wherein said metal ingot has a diameter of at least 9½ inches.

7. The method of claim 1, wherein said metal ingot has a diameter of at least 11 inches.

8. The method of claim 1, wherein said metal ingot has a diameter of from 10 inches to about 20 inches.

9. The method of claim 1, wherein said rectangular slab has a thickness prior to said first rolling that is at least 5 times thicker than the final thickness of said metal article.

10. The method of claim 1, wherein said rectangular slab has a thickness prior to said first rolling that is at least 10 times thicker than the final thickness of said metal article.

11. The method of claim 1, wherein said rectangular slab has a thickness prior to said first rolling that is at least 15 times thicker than the final thickness of said metal article.

12. The method of claim 1, wherein said rectangular slab has a thickness prior to said first rolling that is at least 20 times thicker than the final thickness of said metal article.

13. The method of claim 1, wherein a total true strain reduction imparted by said second rolling is from about 0.10 to about 1.0 of a true strain reduction.

14. The method of claim 1, wherein a total true strain reduction imparted by said second rolling is from about 0.20 to about 0.5 of a true strain reduction.

15. The method of claim 1, wherein said first rolling comprises a rolling schedule defined by changes in mill gap settings.

16. The method of claim 1, wherein a final rolling pass of said second rolling imparts a true strain reduction that is equal to or greater than a true strain reduction imparted by any other rolling pass.

17. The method of claim 1, wherein said metal ingot is niobium, tantalum, or an alloy thereof.

18. The method of claim 1, wherein said metal ingot is copper or titanium or alloys thereof.

19. The method of claim 1, further comprising annealing said slab prior to said first rolling.

20. The method of claim 19, wherein said annealing is under vacuum or inert conditions at a temperature of from about 700° to about 1500° C. for a time of from about 30 minutes to about 24 hours.

21. The method of claim 1, further comprising providing said rectangular slab with two opposing rolling surfaces that are flat to within about 0.02 inches.

22. The method of claim 1, wherein said rectangular slab has a thickness of from about 3 to about 8 inches, a width of from about 3 to about 8 inches, and a length of from about 10 to about 48 inches.

23. The method of claim 1, wherein said intermediate plate has a thickness of from about 0.40 to about 1.5 inches.

24. The method of claim 1, wherein said intermediate plate has a length that is greater than a length of said rectangular slab by about 10% or less.

25. The method of claim 1, further comprising annealing said intermediate plate.

26. The method of claim 25, wherein said annealing is under vacuum or inert conditions at a temperature of from about 700° C. to about 1500° C. for a time of from about 30 minutes to about 24 hours.

27. The method of claim 1, wherein at least one of said rolling passes of said second rolling is in a transverse direction relative to at least one of said rolling passes of said first rolling.

28. The method of claim 1, wherein said rolling passes of said second rolling are multi-directional.

29. The method of claim 1, wherein said metal ingot has a cross-sectional area and said rectangular slab has a cross-sectional area, wherein in forming said rectangular slab, said cross-sectional area of said metal ingot is subjected to a true strain reduction of at least 95% based on a true strain, compared to cross-sectional area of said rectangular slab.

30. The method of claim 29, wherein said true strain reduction in cross-sectional area is at least 100%.

31. The method of claim 1, wherein said true strain reduction is from about 0.06 to 0.15 per pass.

32. The method of claim 1, wherein the subsequent rolling pass in the second rolling is within 25% of the true strain reduction of the previous rolling pass.

33. The method of claim 1, wherein the subsequent rolling pass in the second rolling is within 5% of the true strain reduction of the previous rolling pass.

34. A method of making a metal article having a final thickness comprising:
   a) deforming a metal ingot having a cross-sectional area to form a slab having a cross-sectional area, wherein the cross-sectional area of the slab is at least 95% less based on a total true strain reduction, compared to the cross-sectional area of the metal ingot;
   b) a first rolling of said slab to form an intermediate plate or a metal plate, wherein said first rolling includes a plurality of rolling passes;
   c) optionally, a second rolling of said intermediate plate to form a metal plate, wherein said second rolling includes a plurality of rolling passes, and wherein each of said rolling passes of said second rolling imparts a true strain reduction of about 0.06 or more.

35. The method of claim 34, wherein said cross-sectional area of the slab is at least 100% less.

36. The method of claim 34, wherein said cross-sectional area of the slab is from 95% to 500% less.

37. The method of claim 34, wherein said metal ingot has a diameter of at least 9½ inches.

38. The method of claim 34, wherein said metal ingot has a diameter of at least 11 inches.

39. The method of claim 34, wherein said metal ingot has a diameter of from 10 inches to about 20 inches.

40. The method of claim 34, wherein a total true strain reduction imparted by said second rolling is from about 0.10 to about 1.0 of a true strain reduction.

41. The method of claim 34, wherein a total true strain reduction imparted by said second rolling is from about 0.20 to about 0.5 of a true strain reduction.

42. The method of claim 34, wherein said metal ingot is niobium, tantalum, or an alloy thereof.

43. The method of claim 34, further comprising annealing said slab prior to said first rolling.

44. The method of claim 34, further comprising annealing said intermediate plate or said metal plate or both.

45. The method of claim 34, wherein said second rolling occurs and at least one of said rolling passes of said second rolling is in a transverse direction relative to at least one of said rolling passes of said first rolling.

46. The method of claim 34, wherein said second rolling occurs.

47. The method of claim 34, wherein said first rolling is a clock rolling to form said metal plate.

* * * * *